(12) United States Patent
Spath

(10) Patent No.: US 10,550,476 B2
(45) Date of Patent: *Feb. 4, 2020

(54) HEATED GAS-BEARING BACKER

(71) Applicant: Eastman Kodak Company, Rochester, NY (US)

(72) Inventor: Todd Mathew Spath, Hilton, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 393 days.

This patent is subject to a terminal disclaimer.

(21) Appl. No.: 15/458,345

(22) Filed: Mar. 14, 2017

(65) Prior Publication Data

US 2018/0265981 A1 Sep. 20, 2018

(51) Int. Cl.
| C23C 16/455 | (2006.01) |
| C23C 16/46 | (2006.01) |
| C23C 16/54 | (2006.01) |
| C23C 16/458 | (2006.01) |
| C23C 16/44 | (2006.01) |

(52) U.S. Cl.
CPC .......... *C23C 16/46* (2013.01); *C23C 16/4401* (2013.01); *C23C 16/4583* (2013.01); *C23C 16/45551* (2013.01); *C23C 16/45574* (2013.01); *C23C 16/45578* (2013.01); *C23C 16/545* (2013.01)

(58) Field of Classification Search
CPC .......... C23C 16/4583; C23C 16/45551; C23C 16/46; C23C 16/545; C23C 16/45578; C23C 16/4401; C23C 16/45574
USPC .......... 118/718, 724, 725, 728, 729
See application file for complete search history.

(56) References Cited

U.S. PATENT DOCUMENTS

| 5,136,975 A | 8/1992 | Bartholomew et al. |
| 6,183,565 B1 * | 2/2001 | Granneman ...... C23C 16/45521 |
| | | 118/724 |
| 7,413,982 B2 | 8/2008 | Levy |
| 7,456,429 B2 | 11/2008 | Levy |
| 7,572,686 B2 | 8/2009 | Levy et al. |
| 7,789,961 B2 | 9/2010 | Nelson et al. |
| 7,850,780 B2 | 12/2010 | Levy et al. |
| 8,182,608 B2 | 5/2012 | Kerr et al. |
| 8,211,231 B2 | 7/2012 | Kerr et al. |

(Continued)

FOREIGN PATENT DOCUMENTS

| EP | 1 283 279 | 2/2003 |
| JP | 2005-179705 | 7/2005 |

OTHER PUBLICATIONS

E. Granneman, "Conduction Heating in RTP Fast, and Pattern-independent," Materials Science Forum, vols. 573-574, pp. 375-386.

(Continued)

*Primary Examiner* — Aiden Lee
(74) *Attorney, Agent, or Firm* — Kevin E. Spaulding

(57) ABSTRACT

A gas-levitated substrate backing system includes a gas-levitating backer structure which is used for providing a non-contact force onto a surface of a substrate. The gas-levitating backer structure has an output face including three or more output openings. A gas source provides a gas flow through the output openings to levitate the gas-levitating backer structure over the surface of the substrate. The gas-levitating backer structure is freely moveable in a direction normal to the surface of the substrate.

15 Claims, 24 Drawing Sheets

(56) References Cited

U.S. PATENT DOCUMENTS

| | | |
|---|---|---|
| 8,361,544 B2 | 1/2013 | Fedorovskaya et al. |
| 8,398,770 B2 | 3/2013 | Levy et al. |
| 8,420,168 B2 | 4/2013 | Kerr et al. |
| 8,529,990 B2 | 9/2013 | Fedorovskaya et al. |
| 2009/0130858 A1 | 5/2009 | Levy et al. |
| 2009/0304924 A1 | 12/2009 | Gadgil |
| 2011/0097487 A1 | 4/2011 | Kerr et al. |
| 2011/0097488 A1 | 4/2011 | Kerr et al. |
| 2011/0097489 A1 | 4/2011 | Kerr et al. |
| 2011/0097490 A1 | 4/2011 | Kerr et al. |
| 2011/0097491 A1 | 4/2011 | Levy et al. |
| 2011/0097492 A1 | 4/2011 | Kerr et al. |
| 2011/0097493 A1 | 4/2011 | Kerr et al. |
| 2011/0097494 A1 | 4/2011 | Kerr et al. |
| 2014/0377963 A1 | 12/2014 | Ellinger et al. |
| 2016/0245434 A1 | 8/2016 | Seeley |
| 2017/0101711 A1* | 4/2017 | McGraw ............. C23C 16/4412 |

OTHER PUBLICATIONS

D. Levy et al., "Oxide Electronics by Spatial Atomic Layer Deposition," J. Display Technology, vol. 5, pp. 484-494 (2009).

P. Poodt et al., "Spatial atomic layer deposition: A route towards further industrialization of atomic layer deposition," J. Vac. Sci. Technol. A, vol. 30, pp. 010802-1-010802-11 (2012).

* cited by examiner

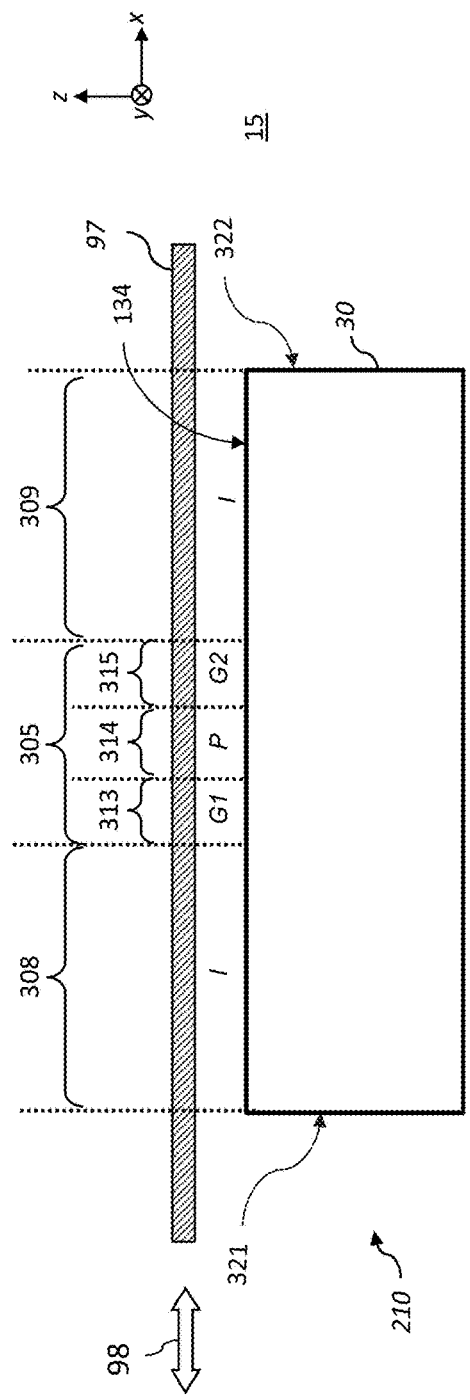
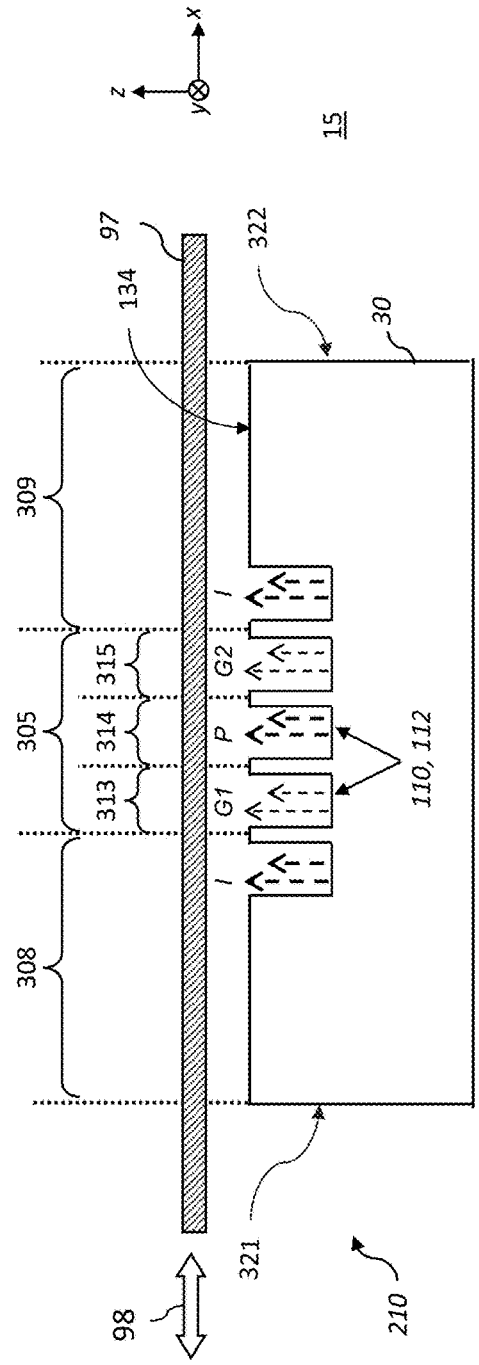
FIG. 2A
FIG. 2B

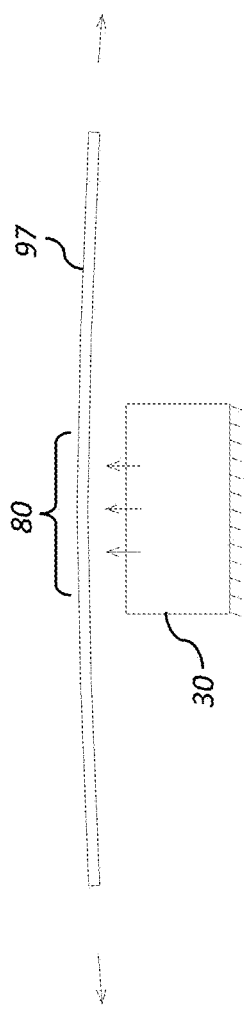
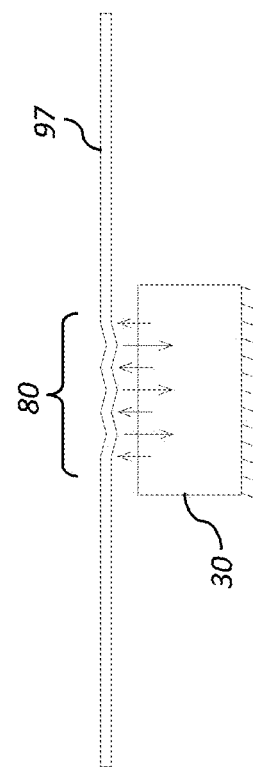

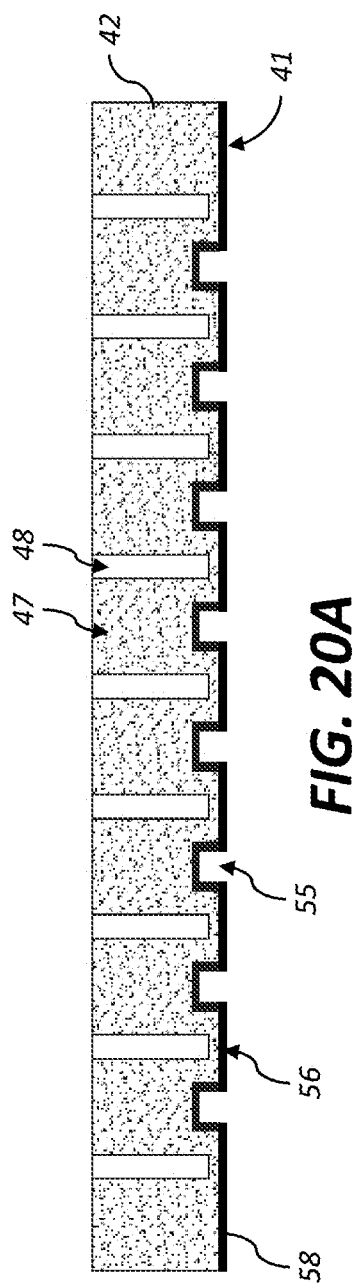
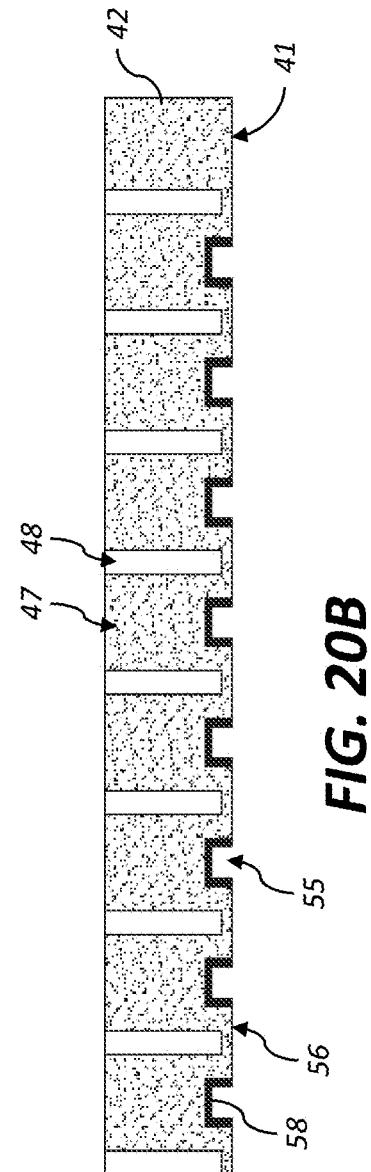

HEATED GAS-BEARING BACKER

CROSS-REFERENCE TO RELATED APPLICATIONS

Reference is made to commonly assigned, co-pending U.S. patent application Ser. No. 15/458,235, entitled "Modular thin film deposition system," by Spath et al.; to commonly assigned, co-pending U.S. patent application Ser. No. 15/458,250, entitled "Deposition system with vacuum pre-loaded deposition head," by Spath et al.; to commonly assigned, co-pending U.S. patent application Ser. No. 15/458,262, entitled "Dual gas bearing substrate positioning system," by Spath; to commonly assigned, co-pending U.S. patent application Ser. No. 15/458,270, entitled "Deposition system with moveable-position web guides," by Spath et al.; to commonly assigned, co-pending U.S. patent application Ser. No. 15/458,287; entitled "Deposition system with repeating motion profile," by Spath et al.; to commonly assigned, co-pending U.S. patent application Ser. No. 15/458,297, entitled "Deposition system with modular deposition heads," by Spath et al.; to commonly assigned, co-pending U.S. patent application Ser. No. 15/458,307, entitled "Porous gas-bearing backer," by Spath et al.; to commonly assigned, co-pending U.S. patent application Ser. No. 15/458,322, entitled "Deposition system with interlocking deposition heads," by Tutt et al.; and to commonly assigned, co-pending U.S. patent application Ser. No. 15/458,335, entitled "Vertical system with vacuum pre-loaded deposition head," by Spath et al., each of which is incorporated herein by reference.

FIELD OF THE INVENTION

This invention generally relates to systems including a gas bearing backer used to manage the backside of a substrate, more particularly to systems for the deposition of thin-film materials using a heated gas-bearing backer.

BACKGROUND OF THE INVENTION

There is a growing interest in depositing thin-film materials from gaseous precursors on a wide range of substrates for a wide variety of applications. Substrates of interest include both rigid substrates, such as flat-panel glass, and flexible substrates, such as plastic webs or metal foils. Flexible supports are of particular interest since they can be more mechanically robust, lighter weight, and allow for more economic manufacturing (e.g., by enabling roll-to-roll processing) than rigid substrates. Thin-film deposition systems, similar to their liquid coating counterparts, are advantaged if the deposition head, or gas delivery device, is smaller in area than the area of the substrate to be coated. For substrates that are continuous, such as webs and foils, the use of a deposition head that is smaller than the area of the substrate is a requirement not just an advantage.

Among the techniques widely used for thin-film deposition is chemical vapor deposition (CVD), which uses chemically reactive molecules that react to deposit a desired film on a substrate. Molecular precursors useful for CVD applications comprise elemental (atomic) constituents of the film to be deposited and typically also include additional elements. CVD precursors are volatile molecules that are delivered, in a gaseous phase, to a chamber in order to react at the substrate, forming the thin film thereon. The chemical reaction deposits a thin film with a desired film thickness.

Atomic layer deposition (ALD) is a thin-film deposition technology that provides excellent thickness control of conformal thin-films. The ALD process segments the thin-film deposition process of conventional CVD into single atomic-layer deposition steps. Advantageously, ALD steps are self-terminating and can deposit one atomic layer when conducted up to or beyond self-termination exposure times. An atomic layer typically ranges from about 0.1 to about 0.5 molecular monolayers, with typical dimensions on the order of no more than a few angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the absence of the other precursor or precursors of the reaction. In temporal vacuum ALD, thin-film growth is accomplished by alternating the delivery of two or more reactive materials, or precursors, into a vacuum chamber in time. Sequentially, a first precursor is applied to react with the substrate, the excess of the first precursor is removed, and a second precursor is then applied to react with the substrate surface. The excess of the second precursor is then removed and the process is repeated. In all ALD processes, the substrate is exposed sequentially to a series of reactants that react with the substrate and are kept isolated from each other to avoid CVD or gas phase reactions. An ALD cycle is defined by the steps required to form a single layer of the overall thin-film material; for a process using two precursors a cycle is defined as the first precursor exposure, a purge step, the second precursor exposure, and a second precursor purge step.

A version of ALD processes known as spatial atomic layer deposition (SALD) employs a continuous (as opposed to pulsed) gaseous material distribution from a deposition head. As distributed from the deposition head, the gaseous precursors are separated in space by the flow of an inert gas, rather than being separated in time. While vacuum chambers can be used with SALD, they are no longer necessary due to the physical separation of the gas flows rather than a temporal separation of the precursors within a single chamber. In SALD systems, the required sequential exposures are accomplished by relative movement between the substrate and the delivery head such that any given point on the substrate sees the necessary sequence of gaseous materials. This relative movement can be accomplished by moving a substrate relative to a fixed delivery head, moving a delivery head with respect to a fixed substrate, or moving both the delivery head and the substrate in order to achieve the desired gas exposure at the substrate. Exemplary SALD processes, are described in commonly-assigned U.S. Pat. Nos. 7,413,982, 7,456,429, 7,789,961, and U.S. Patent Application Publication 2009/0130858, the disclosures of which are incorporated herein by reference. SALD enables operation at atmospheric or near-atmospheric pressures and is capable of operating in an unsealed or open-air environment, making it compatible with web coating.

SALD offers considerable promise as a technique for thin film deposition on a range of substrates. However, in spite of its inherent technical capabilities and advantages, a number of technical hurdles still remain. As in all ALD processes, the thickness of the SALD deposited thin-film is controlled by the number of ALD cycles to which the substrate is exposed, where a cycle is defined by the exposure of the substrate to the minimum required reactant and purge gas flows to form the desired thin-film composition. Due to the process being limited to an atomic layer of growth per cycle, repeated cycles are required to deposit a thin-film having an appreciable thickness. In order to effectively achieve repeated cycles, SALD requires either motion of the substrate past the deposition head or the development of complex equipment such that the delivery head moves with its gas connections, relative to the substrate. Thin-films of appreciable thickness can be accomplished by either 1) using a deposition head containing a sufficient number of gas distribution cycles and moving a substrate (or head) in a unidirectional motion relative to the head (or substrate) or 2) using a head with a limited number of cycles and using relative reciprocating motion. In instances where the substrate or the deposition head are moved by a reciprocating movement, there remains a technical challenge to manage the sequence of gas exposures since the substrate can be exposed to the gases in a different sequence during a forward stroke and a backward stroke. Furthermore, in order to deposit a thin-film over an entire substrate, the substrate or the head may have to travel a long distance in order to expose substrate to the process gases. There remains a need to provide alternative arrangements to both the very large deposition heads and long distance motion profiles such that large substrates may be easily coated.

One alternative to a single large deposition head is to use multiple deposition heads, or modules, within a larger deposition section. Commonly-assigned U.S. Pat. No. 8,182,608 (Kerr et al.), which is incorporated herein by reference, relates to an apparatus for maintaining the alignment or positional relationship between at least two modules in an SALD system. U.S. Pat. No. 8,182,608 describes aligning multiple delivery heads in a 1-D array, addressing the ability to coating longer substrates or provide thicker thin-film coatings. While simplifying the manufacturing of the deposition head, it does not address the challenge of making coatings of different thicknesses using the same tool, or the footprint required for providing a large deposition section in a manufacturing environment. Additionally, there remains a need for a way to arrange modular heads to be able to coat wider substrates without coating defects or non-uniformity. Additionally, there remains a need for a motion profile that enables the use of small deposition heads in order to build up a sufficient layer thickness from an SALD. Furthermore, there remains a need for a substrate handling means for coating on roll-to-roll webs that enables exposure of the substrate to multiple SALD cycles during deposition, while simultaneously moving the substrate smoothly from the feed roll to the take-up roll.

In order to function properly, an SALD system must maintain the separation of the reactant gases. Although separated in space and by a purge gas as delivered by the deposition head, the system must be further designed to insure that the gases do not mix in the region between the deposition head and the substrate. Commonly-assigned U.S. Patent Application Publication 2009/0130858 (Levy), relates to an SALD deposition system and method using a delivery head where the distance between the substrate and the deposition head is maintained by gas pressure. In this device, the pressure of flowing reactive and purge gases is used as a means to control the separation between the deposition head and the substrate. Due to the relatively large pressures that can be generated in such a system, gases are forced to travel in well-defined paths and thus eliminate undesired gas intermixing.

The system of U.S. Patent Application Publication 2009/0130858 operates as a gas-bearing SALD system. The gas bearing operation maintains a close proximity of the substrate to the deposition head, and either the substrate or head must be free to move in the direction normal the deposition head. The use of a gas bearing SALD head is advantaged due to the resultant pressure profiles that separate the precursor gasses by the purge gas and prevent undesired gas intermixing. There remains a need for SALD systems that utilize a gas-bearing deposition head to coat large substrates, particularly for depositions systems with small manufacturing footprints. There remains a need to coat long substrates with deposition heads that are considerably smaller than the coating length, both for piece-parts and particularly for roll-to-roll webs; this need further necessitates novel motion control profiles and substrate handling. There remains a further need for roll-to-roll SALD systems that utilize a gas-bearing deposition head having a simple construction, as well as roll-to-roll systems that can manage potential substrate distortions and can isolate the motion needed for deposition from the global motion of the web through the system. Additionally, there remains a need, for a modular system that can accommodate different substrate form factors, including roll-to-roll webs of substrate, and provide a system that is relatively low in cost and easy to use.

SUMMARY OF THE INVENTION

The present invention represents a gas-levitated substrate backing system for providing heat and a non-contact force onto a surface of a substrate, including:

a gas-levitating backer structure having an output face, wherein the output face includes three or more output openings;

a gas source for providing a gas flow through the output openings; and a heater for heating the gas-levitating backer structure;

wherein the gas-levitating backer structure is freely moveable in a direction normal to the surface of the substrate.

The gas-bearing backer of the present invention has the advantage that it provides a substantially constant non-contact force onto the surface of the substrate. The gas-levitating backer structure includes a heater to elevate the temperature of the substrate without contacting the substrate. This heated gas-levitating backer structure of the present invention provides heat energy without the turbulent forces or waste heat exhaust issues associated with convective heating methods. The heated gas-levitating backer structure can be operated at lower unit temperature than a radiant heater to achieve the equivalent heat flux to the substrate which is important for safety/structural considerations. Furthermore, the heated gas-levitating backer structure of the present invention enables a more compact design with a lower mass than radiant heater approaches.

It is an advantage of the present invention that the backside-gap between the heated gas-levitating backer structure and the substrate is very small, such that there is conductive heat transfer across the levitating gas film, which is an effective means of heat transfer. It is an advantage that energy to heat the heated gas-levitating backer structure can be provided in a non-contact, non-bias-force producing means, keeping the mass of the heated gas-levitating backer structure low.

It has the further advantage that it is continuously self-adjusting and is able to maintain a consistent thermal gap for a wide range of substrates having thickness variations that are significantly larger than the desired thermal gap.

BRIEF DESCRIPTION OF THE DRAWINGS

FIGS. 2A-2C are cross-sectional side views of SALD deposition heads useful in the present invention having a single ALD cycle;

FIG. 4 is a cross-sectional view of a prior art system illustrating the deformation of a flexible substrate positioned above a deposition head having a net positive pressure profile;

FIG. 5 is a cross-sectional view of a prior art system illustrating the deformation of a flexible substrate positioned above a deposition head having a variable pressure profile;

FIGS. 20A and 20B illustrate a method for applying an impermeable coating to vent grooves in a porous material layer;

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

Figure 1:
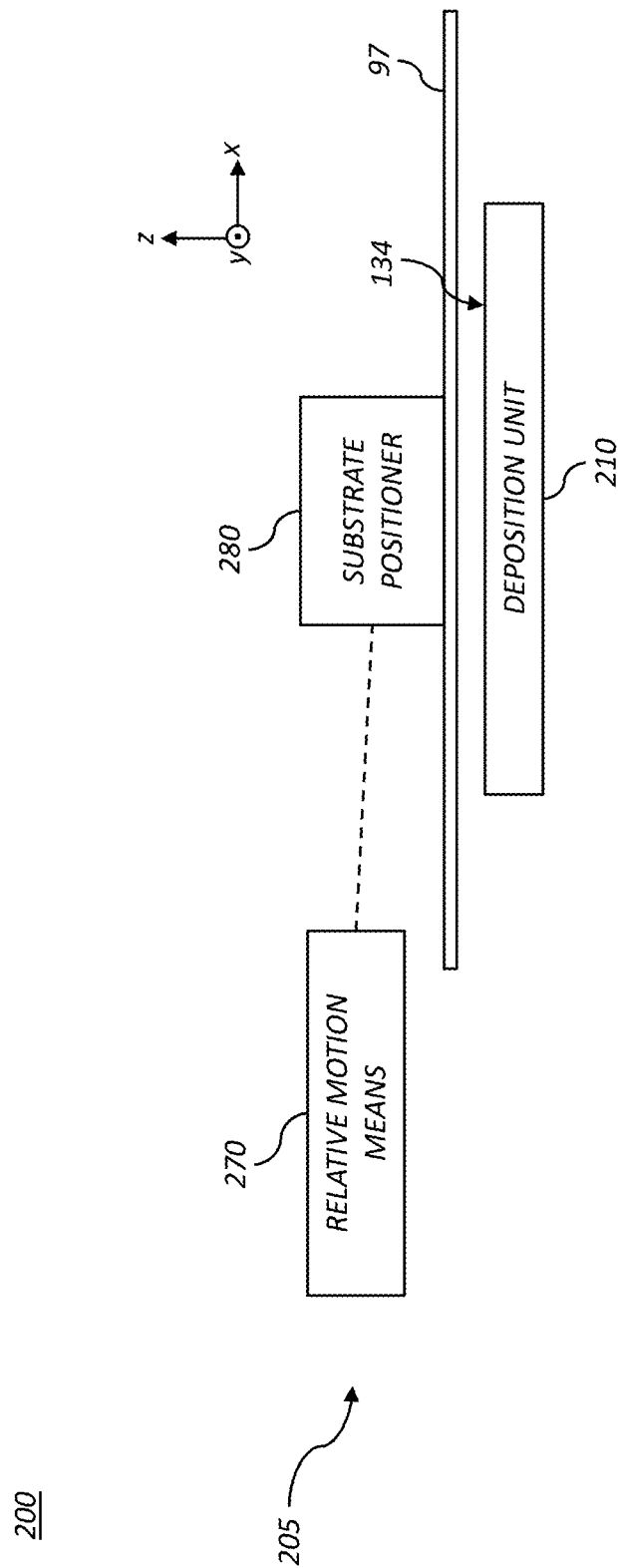
FIG. 1 is schematic block diagram showing the functional elements of an SALD deposition system.

Throughout the specification and claims, the following terms take the meanings explicitly associated herein, unless the context clearly dictates otherwise. The meaning of "a," "an," and "the" includes plural reference, the meaning of "in" includes "in" and "on." Additionally, directional terms such as "on," "over," "top," "bottom," "left," and "right" are used with reference to the orientation of the figure(s) being described. Because components of embodiments of the present invention can be positioned in a number of different orientations, the directional terminology is used for purposes of illustration only and is in no way limiting.

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are generally not mutually exclusive, unless so indicated or as are readily apparent to one of skill in the art. The use of singular or plural in referring to the "method" or "methods" and the like is not limiting. It should be noted that, unless otherwise explicitly noted or required by context, the word "or" is used in this disclosure in a non-exclusive sense. Even though specific embodiments of the invention have been described herein, it should be noted that the present invention is not limited to these embodiments. In particular, any features described with respect to one embodiment may also be used in other embodiments, where compatible. The features of the different embodiments can be exchanged, where compatible.

It is to be understood that elements not specifically shown, labeled, or described can take various forms well known to those skilled in the art. In the following description and drawings, identical reference numerals have been used, where possible, to designate identical elements. It is to be understood that elements and components can be referred to in singular or plural form, as appropriate, without limiting the scope of the invention.

The example embodiments of the present invention are illustrated schematically and are not to scale for the sake of clarity. One of ordinary skill in the art will be able to readily determine the specific size and interconnections of the elements of the example embodiments of the present invention. Therefore, the provided figures are not drawn to scale but are intended to show overall function and the structural arrangement of some embodiments of the present invention.

The embodiments of the present invention relate to components for systems useful for thin-film deposition. In preferred embodiments, the thin-film deposition is done using a spatial atomic layer deposition (SALD) process. For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art. Reactant gas flows can include multiple reactive species together with inert gaseous species. In some embodiments, the reactive gases can include a reactive plasma, such as supplied by a remote plasma source. One type of remote plasma source that can be used includes a surface dielectric barrier discharge source. As such, plasma-enhanced spatial ALD (PE-SALD) arrangements are considered to be useful in some embodiments. While the exemplary embodiments are described in the context of SALD systems, those skilled in the art will recognize that aspects of the present invention can also be used for any application which involves exposing a substrate to one or more gaseous substances, such as chemical vapor deposition processes.

Unless otherwise explicitly noted or required by context (for example, by the specified relationship between the orientation of certain components and gravity), the term "over" generally refers to the relative position of an element to another and is insensitive to orientation, such that if one element is over another it is still functionally over if the entire stack is flipped upside down. As such, the terms "over", "under", and "on" are functionally equivalent and do not require the elements to be in contact, and additionally do not prohibit the existence of intervening layers within a structure. The term "adjacent" is used herein in a broad sense to mean an element next to or adjoining another element. The figures provided are not drawn to scale but are intended to show overall function and the structural arrangement of some embodiments of the present invention.

Embodiments of the present invention are illustrated and described with a particular orientation for convenience; and unless indicated specifically, such as by discussion of gravity or weight vectors, no general orientation with respect to gravity should be assumed. For convenience, the following coordinate system is used: the z-axis is perpendicular to the output face of the deposition head, the x-axis is parallel to the primary motion direction (in the plane of the output face), and the y-axis is perpendicular to the primary motion axis (in the plane of the output face). Roll, pitch, and yaw are as used herein have their commonly understood definitions. To facilitate interpretation of relative motion and degrees of freedom, the following clarifications are provided. Roll is the rotation about an axis parallel to the primary motion axis (x-axis). Pitch is the rotation about the y-axis in the plane of the output face of the delivery device and perpendicular to the primary motion axis. Yaw is the rotation about the z-axis which is normal to the output face of the delivery device.

An ALD process accomplishes thin-film growth on a substrate by the alternating exposure of two or more reactive materials, commonly referred to as precursors, either in time or space. A first precursor is applied to react with the substrate. The excess of the first precursor is removed and a second precursor is then applied to react with the substrate surface. The excess of the second precursor is then removed and the process is repeated. In all ALD processes, the substrate is exposed sequentially to a series of reactants that react with the substrate. The thickness of the ALD (and SALD) deposited thin-films is controlled by the number of ALD cycles to which the substrate is exposed, where a cycle is defined by the exposure to the minimum required reactant and purge gas flows to form the desired thin-film composition. For example, in a simple design, a single cycle can provide one application of a first reactant gaseous material G1 and one application of second reactant gaseous material G2. In order to effectively achieve repeated cycles, SALD requires either motion of the substrate past the deposition head or the development of complex equipment such that the delivery head with its gas connections, can be moved relative to the substrate. Thin-films of appreciable thickness can be accomplished by either 1) using a deposition head containing a sufficient number of gas distribution cycles and moving the substrate (or the deposition head) in a unidirectional motion relative to the deposition head (or substrate) or 2) using a deposition head with a limited number of cycles and using relative reciprocating motion.

In order to effectively use an SALD deposition head for thin-film deposition, it is commonly employed within a larger SALD system, or apparatus. Typically, such systems are specifically designed to deposit thin films on a particular type of substrate (for example, either rigid or flexible). Furthermore, SALD systems typically utilize a singular motion profile type that is chosen as a result of the design of the deposition head and the type of substrate being coated. In many cases, SALD systems are further designed for a specific application, and as such are configured to coat a single material at a given thickness on a substrate having a particular form factor.

As known by one skilled in the art, each SALD system requires at least three functional elements in order to effectively deposit a thin-film, namely a deposition unit, a substrate positioner and a means of relative motion. To date, the specific design of each functional element has generally differed from system to system. As will be described, preferred embodiments of the SALD systems of the present invention are modular in nature, and as such includes a range of components of differing design that can be exchanged to perform the function of a particular functional element within the novel SALD platform. The design and advantages of specific components useful in a range of SALD systems, and design and advantages of inventive elements and configurations of the novel modular SALD platform of the present invention will be better understood with respect to the Figures.

As shown in schematic block diagram of FIG. 1, SALD system 200 of the present invention is preferably one in which a substrate 97 is moved relative to a fixed deposition unit 210. As such, substrate 97 is positioned over the output face 134 of a deposition unit 210 by substrate positioner module 280, and relative motion between the substrate 97 and the deposition unit 210 is accomplished by motion of the substrate positioner module 280 using relative motion means 270, which can also be referred to as a motion controller or a motion control means. The deposition unit 210, substrate positioner module 280 and relative motion means 270 are functional elements of deposition subsystem 205 of SALD system 200. In various embodiments of the present invention, the deposition unit 210 can be a single deposition head 30 or can be a deposition unit that include an array of deposition heads 30. The relative motion means 270 interacts with the substrate positioner module 280 to move the substrate 97 relative to the deposition unit 210.

The substrate positioner module 280 is preferably an interchangeable substrate positioning module, with the modular system having multiple substrate positioning modules that can be easily exchanged into the SALD system 200, where the different substrate positioning modules are configured to handle different types of substrates 97 and different substrate form factors.

Many types of substrates can be coated with the SALD system 200. The substrates 97 used in the present invention can be any material that acts as a mechanical support for the subsequently coated layers. The substrate 97 can include a rigid material such as glass, silicon, or metals. The substrate can also include a flexible material such as a polymer film or paper. Useful substrate materials include organic or inorganic materials. For example, the substrate can include inorganic glasses, ceramic foils, and polymeric materials. The thickness of substrate 97 can vary, typically from about 25 μm to about 1 cm. Using a flexible substrate 97 allows for roll processing, which can be continuous, providing economy of scale and economy of manufacturing relative to flat or rigid supports.

In some example embodiments, the substrate 97 can include a temporary support or support material layer, for example, when additional structural support is desired for a temporary purpose, e.g., manufacturing, transport, testing, or storage. In these example embodiments, the substrate 97 can be detachably adhered or mechanically affixed to the temporary support. For example, a flexible polymeric support can be temporarily adhered to a rigid glass support to provide added structural rigidity during the deposition process. The glass support can be removed from the flexible polymeric support after completion of the manufacturing process. The substrate 97 can be bare indicating that it contains no substantial materials on its surface other the material from which it is composed. The substrate 97 can include various layers and patterned materials on the surface.

The relative motion means 270 is adapted to connect to the interchangeable substrate positioner modules, and as such, the relative motion means 270 and the interchangeable substrate positioner modules preferably contain appropriate mating features. The substrate positioner module 280 is designed to position the substrate 97 in the x- and y-directions relative to the output face 134 of the deposition unit 210. The SALD system 200 may also include a secondary substrate positioner (not shown) which is designed to control the position of the substrate 97 in the z-direction.

In various configurations, the substrate 97 can be attached to a backer device during deposition. The backer device can be used as heat source for the substrate, or to stiffen otherwise flexible substrates. A backer that is temporarily attached to the substrate, by vacuum for example, is intended to move with the substrate during relative motion between the substrate and a fixed deposition head. The backer attachment can provide greatly increased rigidity and flatness to flexible substrates. A backer device useful in the present invention can be larger than the substrate, as might be used to stabilize piece-parts of flexible substrate or approximately the same size as the substrate, or significantly smaller than the substrate when the substrate is rigid and self-supporting. As used herein, the "substrate unit" refers to either the substrate 97 alone or a substrate 97 with an attached backer device; the substrate unit has relative motion relative to the deposition unit 210.

Figure 2C:
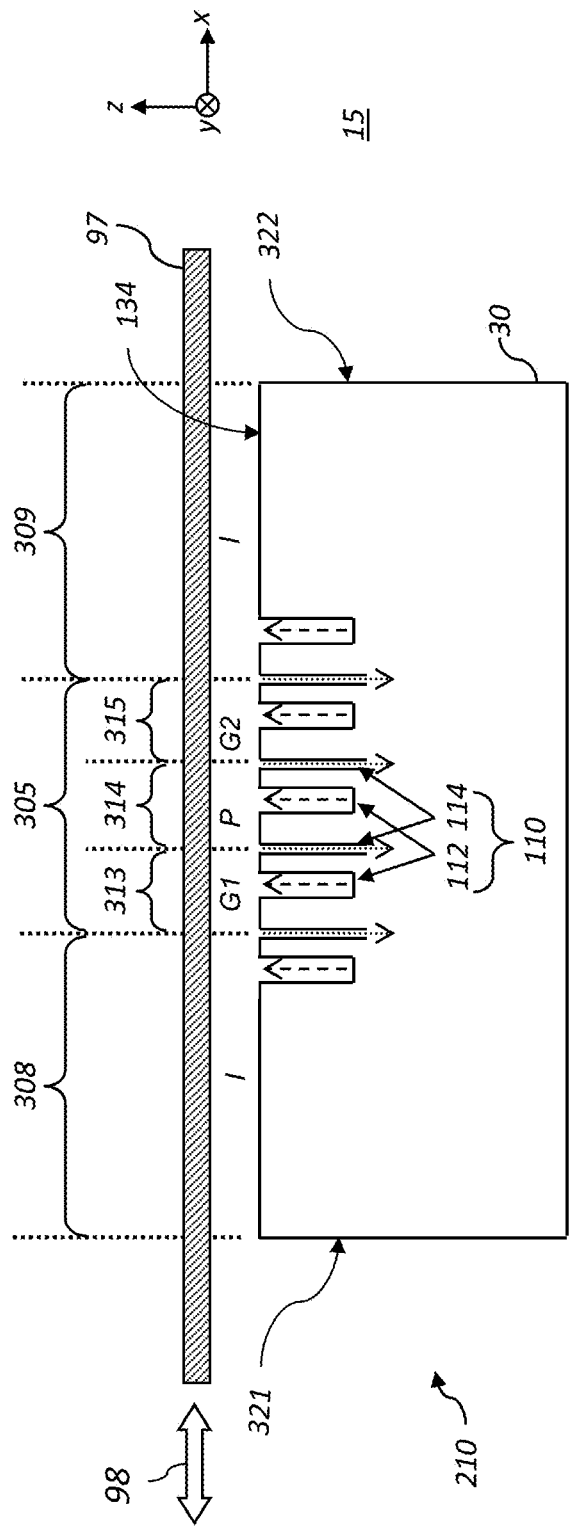

The deposition unit 210 can use any type of SALD deposition head that is known in the art. FIGS. 2A-2C illustrate deposition heads 30 that are configured to simultaneously supply a plurality of gaseous materials from the output face in different gas zones within a deposition zone 305. In all three figures, the deposition zone 305 contains the necessary gas zones for a single two-step ALD deposition cycle. Moving from left to right within the deposition zone 305, there is a first reactive gas zone 313 (G1) followed by an inert gas purge zone 314 (P), and a second reactive gas zone 315 (G2). As the relative motion means 270 (FIG. 1) moves the substrate 97 relative to the deposition head 30 (the x-direction being the primary motion direction as indicated by motion arrow 98), a particular location on the substrate 97 sees the above sequence of gases which results in ALD deposition. Deposition heads 30 of the present can include a deposition zone 305 with gas zones for any number of ALD deposition cycles, the single ALD cycle illustrated is for clarity of understanding.

The SALD systems of the present invention can use any deposition head geometry so long it has the required gas delivery to form gas zones between the deposition head 30 and the substrate 97 in the required order to accomplish an ALD cycle, as illustrated by the simplified deposition head 30 of FIG. 2A. In preferred embodiments, the reactive gases (G1 and G2, for example) have little or no intermixing to avoid a CVD component during film deposition or gas phase reactions. The purge zone 314 (P) serves to separate the reactive gases G1, G2 and allows for the removal of any reaction byproducts from the substrate surface as it moves through the purge zone 314.

A single deposition cycle (moving from left to right) is defined by an inert gas flow I, followed by a first reactive gas flow G1, followed by an inert purge gas flow P, and lastly by a second reactive gas flow G2. The deposition zone 305 has a deposition zone length that spans the distance from the start of the first reactive gas zone to the end of the last reactive gas zone (e.g., from the first reactive gas zone 313 to the second reactive gas zone 315 in FIG. 2A).

The deposition heads 30 illustrated in FIGS. 2A-2C, have extended inert zones 308, 309 on either side of the deposition zone 305. The first inert zone 308 has a first inert zone length that spans the distance from the left edge 321 of the deposition head 30 to the boundary of the first reactive gas zone 313. The second inert zone 309 has a second inert zone length that spans the distance from the boundary of the second reactive gas zone 315 to the right edge 322 of the deposition head 30. The extended inert zones 308, 309 isolate the deposition zone 305 from the external environment 15 and enable the deposition head 30 to coat substrates 97 that are substantially longer than the length of the deposition head 30 without exposing the growth region to the external environment 15. Deposition heads of the prior art are typically operated within a larger system where the external environment is controlled to be inert, under vacuum, or both. In preferred embodiments of the present invention, the deposition head 30 can be used at atmospheric pressure without any additional environmental controls for the external environment 15. One of the advantages of the present invention is that the deposition head 30 and SALD system 200 containing it can be used to coat on substrates 97 whose length is much larger than the length of the deposition zone 305. A further advantage of some embodiments of the present invention is the ability to control the environment of the region of the substrate being actively coated during deposition. Additionally, the relatively small deposition head size allows for lower cost manufacturing of the deposition head.

It is known that ALD is self-limiting, meaning that when all available sites on a substrate surface have reacted with a precursor there is no further reaction during that half-step. When both half-reactions in a deposition cycle have sufficient time and available precursor to reach this state, it is said that the ALD cycle has reached "saturation". ALD depositions done in these conditions are by definition, saturated ALD, and continued exposure to the precursors does not change significantly the deposition amount. In SALD, the substrate velocity and length of reaction zones determine the exposure time to a give precursor. For a given velocity, there is a minimum zone length required to reach saturation (i.e., a "saturation length") and zone lengths longer than the saturation length do not add film thickness during material deposition. SALD systems of the present invention can be used in both saturated and sub-saturated conditions. One advantage of the present invention is that sub-saturated growth can still be deterministic, since each point on the substrate 97 will see the same concentration of precursors for a time which is set by the substrate velocity and motion profile.

The motion arrow 98 indicates one known motion of the substrate 97 useful in SALD which is to move the substrate 97 in a smooth oscillating, or reciprocating, motion through the entire deposition zone 305 such that the substrate "sees" the required number of cycles to produce the desired coating thickness (as discussed above). In preferred embodiments of the present invention the substrate motion is controlled such that the region being actively coated is prevented from experiencing the external environment during coating. This has the advantage of avoiding contamination of the thin-films during growth by preventing exposure to any reactive species or dust particulates or other contaminates that may be present in the external environment outside of the controlled environment defined by the region between the deposition head 30 and the substrate 97.

The deposition head 30 of FIG. 2B illustrates an embodiment where one or more of the gas zones use a transverse arrangement, such as that disclosed in the aforementioned commonly-assigned U.S. Pat. No. 7,456,429 (Levy et al.), entitled "Apparatus for atomic layer deposition." In a transverse flow arrangement, the flow of gases during deposition is orthogonal, or transverse, to the direction of substrate motion and is exhausted either out the edges of the deposition head 30, or into exhaust slots along the perimeter of the deposition head 30. As illustrated, the deposition head 30 has gas slots 110 (i.e., output slots 112) that are configured to supply the gases into their corresponding gas zones. In other embodiments, the deposition head 30 provides gas to the elongated parallel gas zones through an array of orifices, rather than through the illustrated output slots 112 (elongated channels).

The deposition head 30 of FIG. 2C illustrates a preferred gas bearing deposition head 30 of the present invention. The principles and design of gas bearing deposition heads 30 has been described in detail in the aforementioned U.S. Patent Application Publication 2009/0130858, as well as in commonly-assigned U.S. Pat. No. 7,572,686 (Levy et al.) and entitled "System for thin film deposition utilizing compensating forces." As shown in FIG. 2C, an exemplary deposition unit 210 includes a deposition head 30 that operates on a vacuum-preloaded gas bearing principle having an output face 134 (facing upward) having gas slots 110 which provide gases into the gas zones and exhaust gases from the gas zones. Gases are provided into the gas zones by spatially separated elongated output slots 112 (extending in the y-direction). Each gas zone includes a corresponding output slot 112. Adjacent exhaust slots 114 remove (or exhaust) gas from the gas zones. The exhaust slots 114 are positioned to define the boundaries of the various gas zones. As illustrated, the gas zones are equivalent to those of FIGS. 2A and 2B.

In these preferred embodiments wherein the deposition head 30 operates using a gas bearing principle the substrate 97 is positioned above the output face 134 of the deposition head 30 and is maintained in close proximity to the output face 134 by an equilibrium between the pull of gravity, the flow of the gases supplied to the output face 134 through the output slots 112, and a slight amount of vacuum at the exhaust slots 114. While the gas openings in this example are gas slots 110 (also referred to as gas channels) that extend in the y-direction, one skilled in the art will recognize that the gas openings could also have other geometries, such as a row of nozzles or circular orifices, so long as the proper gases are delivered into and exhausted from the gas zones between the deposition head and the substrate.

As shown in FIG. 2C, the gases are introduced and exhausted in alternating output slots 112 and exhaust slots 114 in the output face 134 of the deposition head 30. The flow of gases between the output slots 112 during deposition is primarily in the direction of substrate travel (forward and backward) toward the adjacent exhaust slots 114. As discussed earlier, the region that spans the reactive gas zones can be referred to as the deposition zone 305, which is preferably surrounded by two inert zones 308, 309. The individual gas zones within the deposition zone 305, where the substrate 97 is exposed to each gas, generally extend outward from the corresponding output slot 112 to the two adjacent exhaust slots 114 as illustrated for the first reactive gas zone 313, the purge zone 314, and the second reactive gas zone 315. In the illustrated configuration, the extended inert zones 308, 309 extend from the inert gas output slots 112 to the edges of the deposition head 30. In alternative embodiments, the extended inert zones 308, 309 can include additional output slots 112 or other gas supply features. Additionally, the extended inert zones 308, 309 can include exhaust slots 114, or other exhaust features, to provide additional protection/separation from the external environment 15.

Using any of the embodiments of deposition head 30 of FIGS. 2A-2C, an SALD deposition process can be accomplished by oscillating the position of the substrate 97 across the deposition head 30 (in the in-track direction indicated by the motion arrow 98) for the number of cycles necessary to obtain a uniform deposited film of the desired thickness for the given application.

Figure 3A:
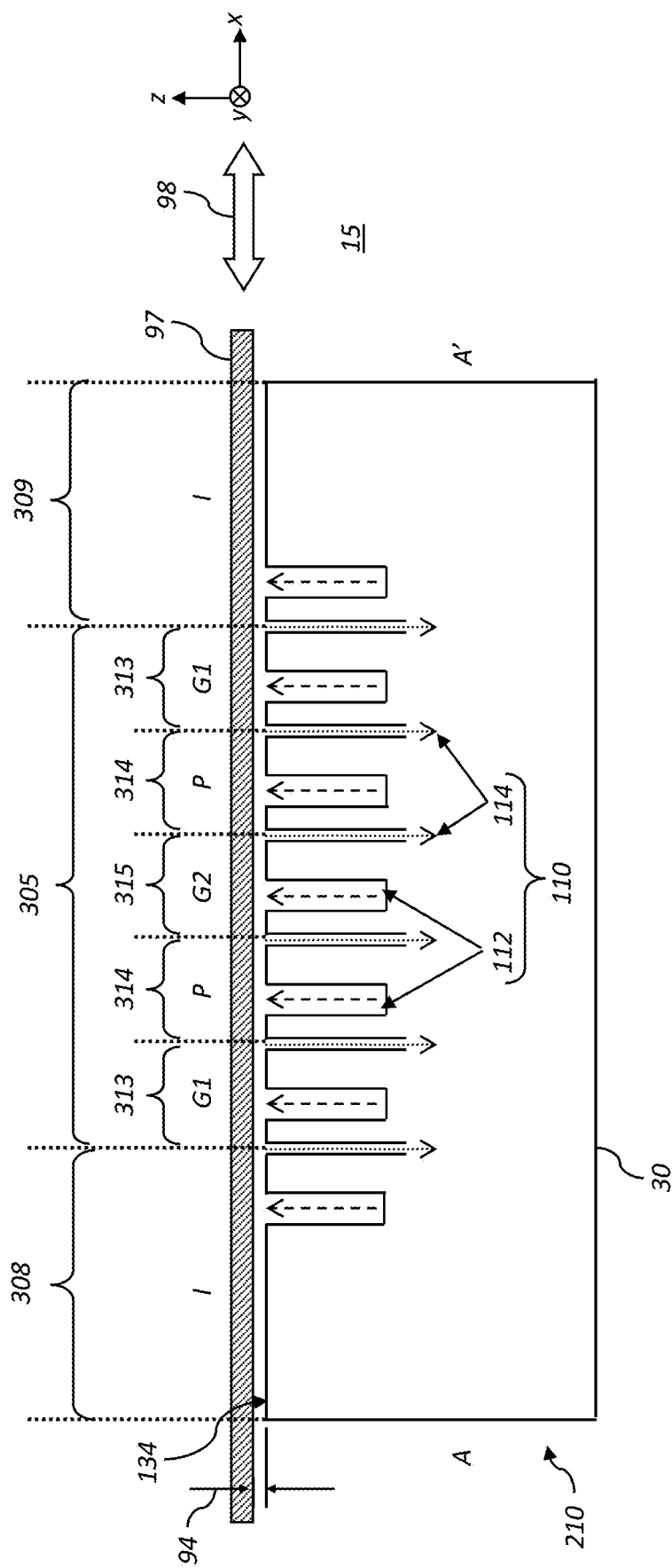
FIG. 3A is a cross-sectional side view of an alternative embodiment of an SALD deposition head having 1.5 ALD cycles.
Figure 3B:
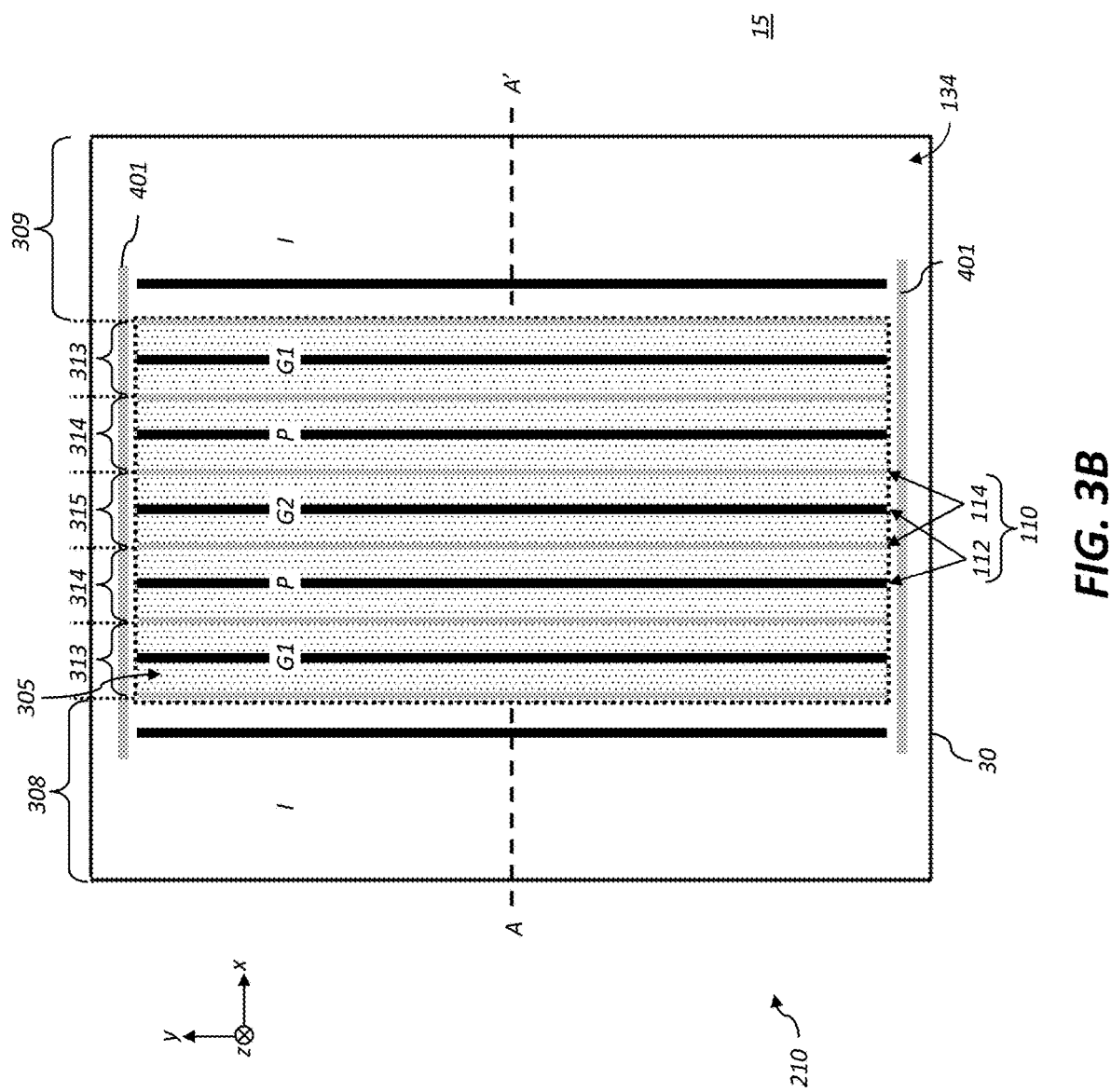
FIG. 3B is a plan view of the SALD head of FIG. 3A.

FIG. 3A is a cross-sectional view of a deposition head 30 illustrating a preferred embodiment of the present invention where the deposition zone 305 is arranged to be symmetric, so that as the substrate 97 is moved relative to the deposition head 30 a position can "see" a full cycle exposure in either a forward or reverse direction. FIG. 3B illustrates a plan view corresponding to the cross-sectional view of FIG. 3A, where the cross-sectional view is taken along the line A-A' of the plan view. In common parlance, the deposition head 30 illustrated in FIG. 3A-3B can be referred to a "one-and-a-half cycle head" or a "1.5 cycle head." Moving from left-to-right through the deposition zone 305, the substrate 97 is exposed to (in order) a first reactive gas zone 313 where the substrate is exposed to a first reactive gas G1, an inert purge zone 314 where the substrate is exposed to an inert purge gas P, a second reactive gas zone 315 where the substrate is exposed to a second reactive G2, another inert purge zone 314 where the substrate is exposed to the purge gas P, and another first reactive gas zone 313 where the substrate is exposed to the first reactive gas G1. Moving in the reverse direction from right-to-left through the deposition zone 305, the substrate 97 is exposed to the same sequence of gases as in the forward (left-to-right) direction, namely the first reactive gas G1, the inert purge gas P, the second reactive gas G2, the inert purge gas P, and the first reactive gas G1. The advantage of this symmetry is that feeding the substrate 97 from left-to-right or right-to-left results in equivalent exposure, and entrance and exit sides of the deposition head 30 depend of the direction of relative motion of the substrate 97 not the design of the deposition head 30.

As with the previous embodiments, the gas zones (or regions) are between the substrate 97 and the deposition head 30. The labels in FIG. 3A are placed above the substrate for clarity and to further emphasize the small working distance 94 between the process-side of substrate 97 and the output face 134 of the deposition head 30 enabled by the use of a vacuum-preloaded gas bearing deposition head 30. As illustrated in the plan-view of FIG. 3B, in addition to the output slots 112 (shown as black lines) and the exhaust slots 114 (shown as gray lines) in the deposition zone 305 (shown as a shaded area), there are additional output slots 401 orthogonal to the gas slots 110 in the deposition zone 305. The additional gas output slots 401 provide inert gas to the cross-track edge region of the deposition head 30, providing further isolation of the deposition zone 305 from the external environment 15.

The exemplary gas bearing deposition head 30 of FIG. 3A has gas slots 110 corresponding to 1.5 ALD cycles to provide the proper sequence of gas exposure in the forward and reverse directions. As the substrate 97 is oscillated back and forth over the deposition head 30, it will provide only a single ALD cycle (one G1 and one G2 exposure) per single direction pass over the deposition head 30, therefore a round trip oscillation provides two ALD cycles. Furthermore, when the second precursor G2 is reactive with the external environment, while the first precursor G1 is not, this arrangement provides additional protection against unwanted reactions involving G2. An example of a precursor pair that would benefit from this arrangement is water and trimethylaluminum (TMA), where water is the non-reactive precursor G1 and TMA is the highly reactive precursor G2.

The deposition head 30 is preferably constructed of a material which does not react with the precursor gases and can withstand the required temperatures without significant deformation. One preferable material is stainless steel. It is recognized that other materials can also be used, but differential thermal expansions must be kept low to prevent distortions. As described, the deposition head 30 delivers multiple reactive and inert process gasses through output face 134. Connection of the various gas sources to the deposition head 30 can be accomplished using individual pipe or tubing connections distributed about the periphery of the deposition head 30. In an exemplary configuration, commercially available fittings, such as Swagelok VCR series components, are used for gas source connections. In preferred embodiments, the gases are supplied to the deposition head 30 via a manifold.

A relatively clean external environment is useful to minimize the likelihood of contamination, but is not necessary. Full "clean room" conditions or an inert gas-filled enclosure can be used in systems of the present invention, however preferred embodiments do not be require control of the external environment and are advantaged for that reason. The apparatus of the present invention is advantaged in its capability to perform deposition onto a substrate 97 over a broad range of temperatures, including room temperature, or near-room temperature, in some embodiments. The apparatus of the present invention can operate in a vacuum environment, but is particularly well suited for operation at or near atmospheric pressure. In preferred embodiments, the SALD process can be performed at or near atmospheric pressure and over a broad range of ambient and substrate temperatures, preferably at a temperature of under 300° C.

As previously discussed, exemplary configurations for SALD systems 200 use a vacuum-preloaded gas bearing deposition head 30. Exemplary designs for the vacuum-preloaded gas bearing deposition 30 head include alternating gas output slots 112 and exhaust slots 114 (i.e., vacuum slots). When used to process small rigid substrates 97, it is possible to operate the SALD system 200 without the use of a substrate backer, or alternatively to use a rigidly attached backer. For larger substrates 97, there is a need for the system to include a non-contact heat source. For larger flexible substrates 97 there is a particular need to manage the distortion of the substrate 97 that may be caused by the pressure fields in the deposition zone.

As previously described, an SALD deposition head 30 operating as a vacuum-preloaded gas bearing, provides the advantages of high efficiency of materials utilization, freedom from gas intermixing, and fast reaction kinetics when operating with a separation between the substrate 97 and the output face 134 of the deposition head 30 that is very small. In some configuration, such as is described in commonly-assigned, co-pending U.S. patent application Ser. No. 15/458,235 to Spath et al., entitled "Modular thin film deposition system," which is incorporated herein by reference, a substrate backer device can be used in these systems to act as a heat source for the substrate 97 in order to achieve process temperature aims. In some configurations, the backer device serves as a barrier to convective and radiative heat loss without active heating. In some applications, the substrate unit includes a backer device that is temporarily attached to the substrate 97, and that moves with the substrate 97 during deposition. However, when coating large aspect ratio substrates 97, particularly substrates 97 that are considerably longer than the deposition head 30, it is desirable to have a backer which does not move during deposition, and is stationary with respect to the relative motion of the substrate 97 and the deposition head 30. When coating continuous web substrates 97, as in a roll-to-roll process, the utility of the stationary gas-bearing backers of the present invention are particularly advantaged.

It is known in the art to use a gas-bearing backer in SALD systems to help maintain substrate position. However, prior art disclosures are limited to gas-bearing backers having a rigid, or fixed, position. The use of prior art gas-bearing backers can be considered to fall with two categories, those used with separate mechanically fixed positioning devices, or systems where a substrate is fed between two fixed, parallel gas bearings where one or both of the gas bearings are configured for SALD deposition. For example, commonly-assigned U.S. Patent Application Publication 2011/0097491 (Levy et al.), entitled "Conveyance system including opposed fluid distribution manifolds," discloses a gas-bearing backer in conjunction with guide rollers. The gas pressure provided by the backer is used to force the substrate into contact with the guide rollers. The roller-to-deposition head distance (h) thereby controls the gap between the deposition head and the deposition side of the substrate.

In another example, an article entitled "Conduction Heating in RTP Fast, and Pattern-Independent" (Materials Science Forum, ISSN: 1662-9752, Vols. 573-574, pp 375-386, 2008) by E. Granneman discloses a rapid thermal processing device that uses a dual-sided gas bearing configuration in which arrays of discrete orifices in opposing firmly mounted (i.e., fixed-position) gas delivery devices provide the high forces necessary to suspend (relatively) rigid wafers within the fixed gap between two fixed gas bearings. The thickness of the substrate is limited to what will fit in the fixed gap. Granneman notes that heat transfer by thermal conduction across a gas layer is dominant when the layer is on the order of 150 μm or less. For the intended purposes of the Granneman system, namely the transport of standardized thickness wafers for thermal processing, the 150 μm nominal clearance (per side of the substrate) is more than adequate to accommodate normal thickness variation of the wafers without causing risk of collision or a significant change in heat transfer coefficient.

The backside-bearing backer of the present invention serves as a safety device, preventing a flexible substrate from detaching from a vacuum preloaded deposition head 30 in the event of a disturbance, such as can be caused by interruption in the exhaust gas flow. For roll-to-roll SALD coating systems, it is desirable to design the web path to minimize the likelihood of damaging the web. For example, to avoid scuffing the web on the corners of the deposition head 30, the web tension can include an out-of-plane component directed away from the output face of the deposition head 30. While useful, this tension can cause the web to lift away from the output face after a disturbance to a point that exhaust vacuum is unable to reestablish a preload condition. The use of a backside-bearing backer in accordance with the present invention provides a force on the web of substrate toward the deposition head 30 that counteracts the out-of-plane tension component, allowing the process side of the web of substrate to be maintained within close proximity to the output face of the deposition head 30.

The use of deposition heads 30 with flexible substrates 97 can cause a number of problems that can be addressed using backside-bearing backers in accordance with the present invention. In some prior-art designs, such as that illustrated in FIG. 4, the deposition head 30 supplies only positive pressure gas within the gas delivery zone 80, and the exhaust is either at the edge of the deposition head 30 or at the edge of the substrate 97. Deposition heads 30 of this type include the previously discussed transverse design. As illustrated by the cross-sectional view shown in FIG. 4, flexible substrates 97 positioned above a deposition head 30 with a net positive pressure profile can be easily deformed by the gas pressure from the deposition head 30. This unwanted substrate distortion leads to an uneven process-side gap between the deposition head 30 and the substrate 97, increasing the potential for unwanted precursor intermixing. More preferably, deposition heads 30 for use with the present invention have a preloaded-vacuum gas bearing design which uses a multitude of parallel elongated slots, which form alternating positive pressure zone (corresponding to output slots) and negative pressure zones (corresponding to exhaust slots) with respect to the local external environment. This arrangement results in laminar gas flow, parallel to the plane of the output face of the deposition head 30, in the direction of substrate travel within the gap between the deposition head 30 and the substrate 97. The local pressure profiles are approximately mirror symmetric about the exhaust slots, creating a "saw tooth" pressure profile across the expanse of the active gas delivery zone 80 of the deposition head 30. As illustrated in FIG. 5, when the substrate 97 is unsupported on its back side, the saw tooth pressure profile causes deformation of the flexible substrate 97, resulting in the formation of standing wave "corrugations." In some configurations, the slots the deposition head 30 extend across the majority of the width of the substrate 97. In this arrangement, the corrugations in unsupported flexible substrates 97 tend to continue to the nearby edges of the substrate 97 where they can vent the high pressure source gas to the external environment (ambient atmosphere), thus collapsing the levitation of the substrate 97 from the deposition head 30. In extreme cases, for example with substrates 97 having a low flexural stiffness, the substrate 97 can make contact with the deposition head 30 at or near the low-pressure exhaust slots (also known as "sink" slots) in the deposition head 30. Any contact is likely to cause destruction of the integrity of a thin film coating by way of scratching or abrasion.

In SALD systems 200 coating flexible webs of substrate 97, there is a need to maintain flatness during deposition. In typical web coating operations, the web tension can be used to assist in managing the substrate flatness. However, the effectiveness of web tension as a solution is limited at elevated deposition temperatures with polymeric substrates. In-track web tension can be employed in SALD systems to reduce corrugation amplitude to a degree. However, the amount of tension that can be acceptably applied is limited by the tensile creep behavior of the substrate and the process time and temperature that the substrate will be subjected to. For flexible polymeric substrates 97 worked at high temperature, the acceptable tension is severely limited. Allowance of excessive creep can result in cracked brittle coatings (e.g., for metal oxides), misalignment of pre-patterned features in subsequent operations due to web elongation, reduction in thickness or width of the outgoing web due to Poisson's effect, compromised tensile strength and planarity, or other defects.

Figure 6:
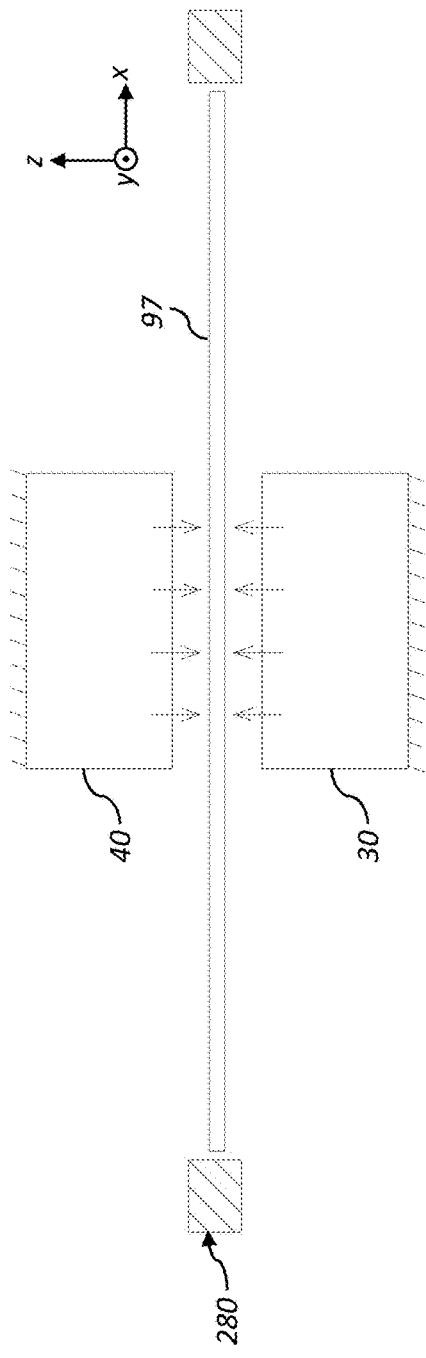
FIG. 6 is a cross-sectional view of a prior art system with a deposition head having a net positive pressure profile and a matching gas-bearing backer.
Figure 7:
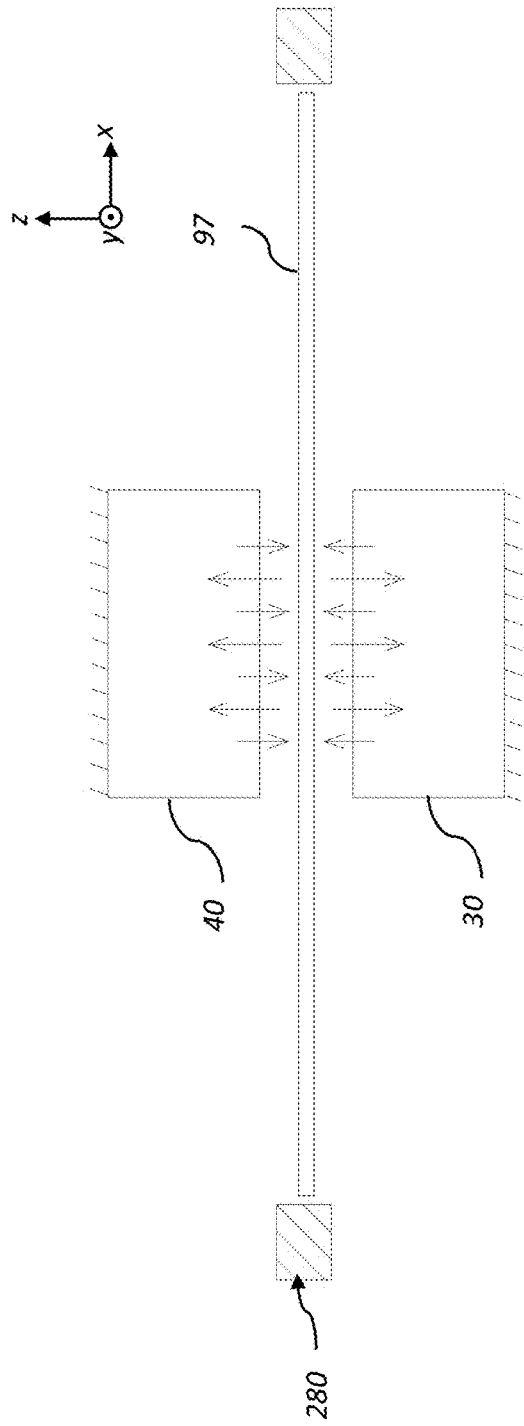
FIG. 7 is a cross-sectional view of a prior art system with a deposition head having a net variable pressure profile and a matching gas-bearing backer.

The use of a gas-bearing backer can serve to maintain the flatness of, or to actively flatten, a flexible web. Prior art designs, such as those illustrated in FIGS. 6 and 7 have used a fixed, non-contact, gas-bearing backer 40 in a parallel plane opposite the deposition head 30. The deposition head 30 in FIG. 6 is a positive pressure design similar to that shown in FIG. 4, and the deposition head 30 in FIG. 7 is a preloaded-vacuum gas bearing design similar to that shown in FIG. 5. In these examples, the gas-bearing backer 40 is fixed in place and is a mirror image of the corresponding deposition head 30. A substrate positioner 280 moves the substrate 97 laterally over the deposition head 30. Such designs have been found to be unduly expensive and difficult to operate. In order for the systems of FIGS. 6 and 7 to exactly balance the pressure profile from the active deposition head 30, the geometry of the slot positions and the gas flow rates emanating from the individual slots need to be closely matched in the fixed gas-bearing backer 40. The gas flows for the deposition heads 30 are commonly controlled by multiple mass flow controllers (MFC's), which are settable according to a specified "recipe." The gas flows for the fixed gas-bearing backers 40 would need similar individual port level controls to be balanced under all process variations, which would incur a significant expense. Additionally, the fixed gas-bearing backer 40 requires precise alignment to the deposition head 30. In conditions where the gas bearing stiffness of the deposition head 30 and fixed gas-bearing backer 40 are similar, the resultant suspension is prone to oscillatory out-of-plane motion (aka: flutter). Also, the positions of the fixed gas-bearing backer 40 and deposition head 30 positions must provide sufficient clearance to accommodate the full range of substrate thickness variability, therefore the range of substrate thickness that can be used with good gap control is limited in these prior art systems.

The process-gap between the deposition head 30 and the substrate 97 is preferably on the order of 30 µm or less for SALD, with process-gaps on the order of 5-15 µm being even more desirable. The backside-gap between substrate 97 and gas-bearing backer 40 must be of similar order to constrain the corrugation amplitude of flexible substrates 97, and is typically less than 20 µm. In preferred operating conditions, the sum of the gaps (i.e., the distance between the output face of the deposition head 30 and the output face of the gas-bearing backer 40, minus the thickness of the substrate 97) is on the order of, or even smaller than, the thickness tolerance of many commercial substrates of interest. For example, the thickness tolerance of commodity PET is about 0.7 mils (i.e., about 18 µm). In some processes, the thermal expansion of the web, or of the machine apparatus, can also be limiting. Therefore, any arrangement wherein the gas-bearing backer 40 is in a fixed position will be prone to jamming when operated at the desired close proximity for SALD. The present invention provides a gas-bearing backer 40 that "floats" on the web of substrate 97 with a constant net force (i.e., "zero stiffness"), thereby enabling the desired small backside-gap and process-gap to be maintained on each side of the substrate 97 in the presence of web variation and without causing a change in pressure profile on the deposition side of the web.

Figure 8:
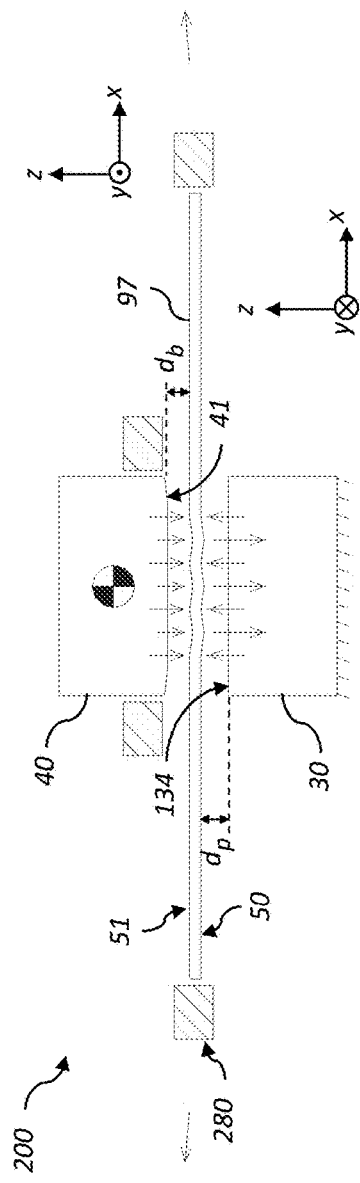
FIG. 8 illustrates a system including a deposition head and a gas-bearing backer with a flexible substrate in accordance with an exemplary embodiment.

In preferred embodiments, an SALD system 200 of the present invention is a two bearing system including a vacuum-preloaded gas bearing deposition head 30 and a low-stiffness gas-bearing backer 40, which together maintain the distance of the substrate 97 from the output face 134 deposition head 30 (i.e., process gap $d_p$) during the thin-film deposition process. FIG. 8 illustrates an exemplary SALD system 200 in which a deposition head 30, a flexible substrate 97 to be coated, and a gas-bearing backer 40 are arranged in a vertical stack. The deposition head 30, which is a type of high-stiffness gas bearing, is positioned with its output face 134 oriented in a horizontal plane and facing a first surface 50 (i.e., the "process side") of the substrate 97. The low-stiffness gas-bearing backer 40 is positioned with its output face 41 facing an opposite second surface 51 (i.e., the "non-process side") of the substrate 97. The gas-bearing backer 40 can freely move in a direction normal to its output face 41 and floats over the substrate 97. The gas-bearing backer 40 is optionally heated.

The gas-bearing backer 40 differs from conventional gas-bearings which are positioned between two machine elements to "bear" the load of one element and transfer it to the other. The gas-bearing backer 40 in the configuration of FIG. 8 does not primarily serve to "bear" the load of a second machine element, nor to provide guidance for a second machine element. Rather, it functions is to "back up" the substrate 97 by providing a substantially constant non-contact force onto the substrate 97, and secondarily to provide heat to the substrate 97. Therefore, gas-bearing backer 40 can alternately be referred to as a "gas-levitated substrate backing system" or a "gas-separated substrate backing system."

The term "stiffness" is used to have its commonly understood mechanical meaning of force per unit displacement. When applied to gas bearings, stiffness refers to force and displacement in the normal direction from the bearing face. As applied to the dual-bearing system of the present invention, the displacement is the change in position in the substrate in the direction normal to the output face of the gas bearing. In the present invention, a "low-stiffness" gas bearing has the ability to freely move in the normal direction, and the force imparted on the substrate is substantially independent of the position of the substrate relative to its output face. In contrast, the force imparted by a "high-stiffness" gas bearing is responsive to the position of the substrate relative to its output face. The low-stiffness gas bearings of the present invention have a stiffness close to zero. The high-stiffness gas bearings of the present invention have at least an order of magnitude (10×) greater stiffness than the low-stiffness bearing, preferably at least 100×, or more preferably at least 1000×. High-stiffness gas bearings in preferred embodiments are vacuum-preloaded gas bearings, more preferably are vacuum-preloaded gas bearing deposition heads.

In the arrangement of FIG. 8, the position of the substrate 97 is moveable in a direction normal to the output face 134 of deposition head 30. The gas supplied from the output face 134 of the deposition head 30 forms a gas film between the deposition head 30 and the substrate 97, and imparts a first net force onto the first surface 50 of the substrate 97. The substrate 97 is supported, or levitated, by the gas film between the substrate 97 and the output face 134 of the deposition head 30. The position of the gas-bearing backer 40 is unconstrained and moveable in a direction normal to the output face 134 of the deposition head 30. The second surface 51 of the substrate 97 is separated from the gas-bearing backer 40 by a backside gas film that is supplied from the output face 41 of the gas-bearing backer 40. The backside-bearing is levitated by the gas film emanating from its output face 41 and imparts a second net force onto the second surface 51 of the substrate 97. The position of the gas-bearing backer 40 is responsive to a gas flow through its output face 41 to provide a backside-gap $d_b$ between the gas-bearing backer 40 and the second surface 51 of the substrate 97 that is preferably no more than 50 µm. Typically, the only load supported by gas flow from the gas-bearing backer 40 is the weight of the gas-bearing backer 40 itself.

The vacuum-preloaded gas bearing deposition head 30 of the preferred configuration is capable of providing both attractive as well as repulsive forces, and has a high-stiffness characteristic. Consequently, there is a rapid change in the normal force as a function of the gas film thickness (i.e., the thickness of the process gap $d_p$). This can be enabled by head designs which include a high friction factor in the positive pressure sources provided by the output channels of the deposition head 30 and a low friction factor vacuum preload provided by the exhaust channels.

The gas fluid bearing existing between the substrate and the gas-bearing backer 40 functions to transfer the weight of the gas-bearing backer 40 to the substrate 97 as an additional preloading force on the vacuum-preloaded gas bearing deposition head 30. The gas-bearing backer 40 can have any stiffness so long as it performs this function. In the illustrated configuration, the gas-bearing backer 40 is free to seek an equilibrium position in the z-direction (given the gas flow and mass of the gas-bearing backer 40), therefore the net force from the gas-bearing backer 40 is only a function of its weight and will be constant. In a preferred configuration, the non-contact force applied to the surface of the substrate 97 by the gas-bearing backer 40 is no more than about 1.0 pound per square inch of the output face 41, and more typically is no more than about 0.2 pounds per square inch. The effect of the gas-bearing backer 40 suspension is to provide a zero stiffness load on the substrate 97 regardless of the actual backside gas film stiffness. The combination of high stiffness on the deposition side of the substrate 97 and zero stiffness on the backside provides an inherent latitude for changes in the thickness of the substrate 97 and provides an independence from influences that exist in systems with rigid structural mounting. The gas-bearing backer 40 operates in extremely close proximity to the backside (i.e., the second surface 51) of the substrate 97. The gas-bearing backer 40 is advantageously designed with an overall normal stiffness that is 1 to 2 orders of magnitude less than a typical commercial machine guide gas bearing and is also designed to have a flatter pressure profile than would be achieved through typical gas bearing construction and operating conditions. Despite its low stiffness, the gas-bearing backer 40 provides a flattening functionality to improve planarity of the flexible substrate 97.

Figure 9:
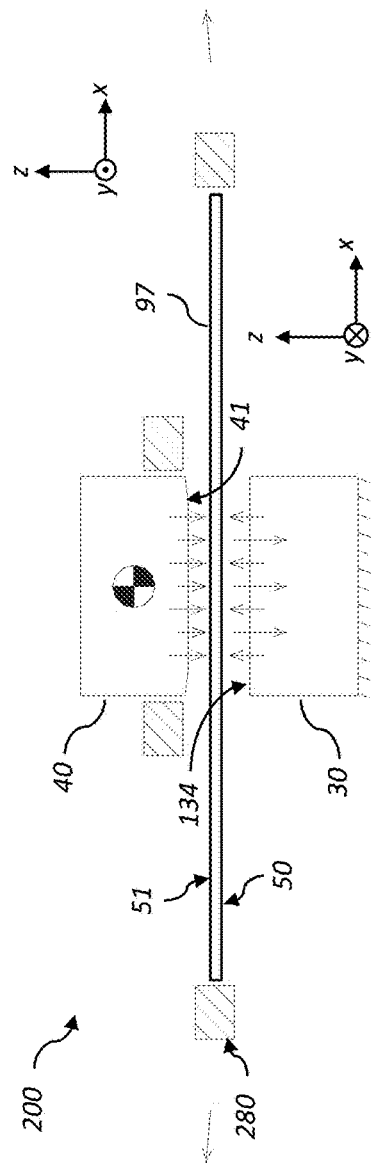
FIG. 9 illustrates a system including a deposition head and a gas-bearing backer with a rigid substrate in accordance with an exemplary embodiment.
Figure 10:
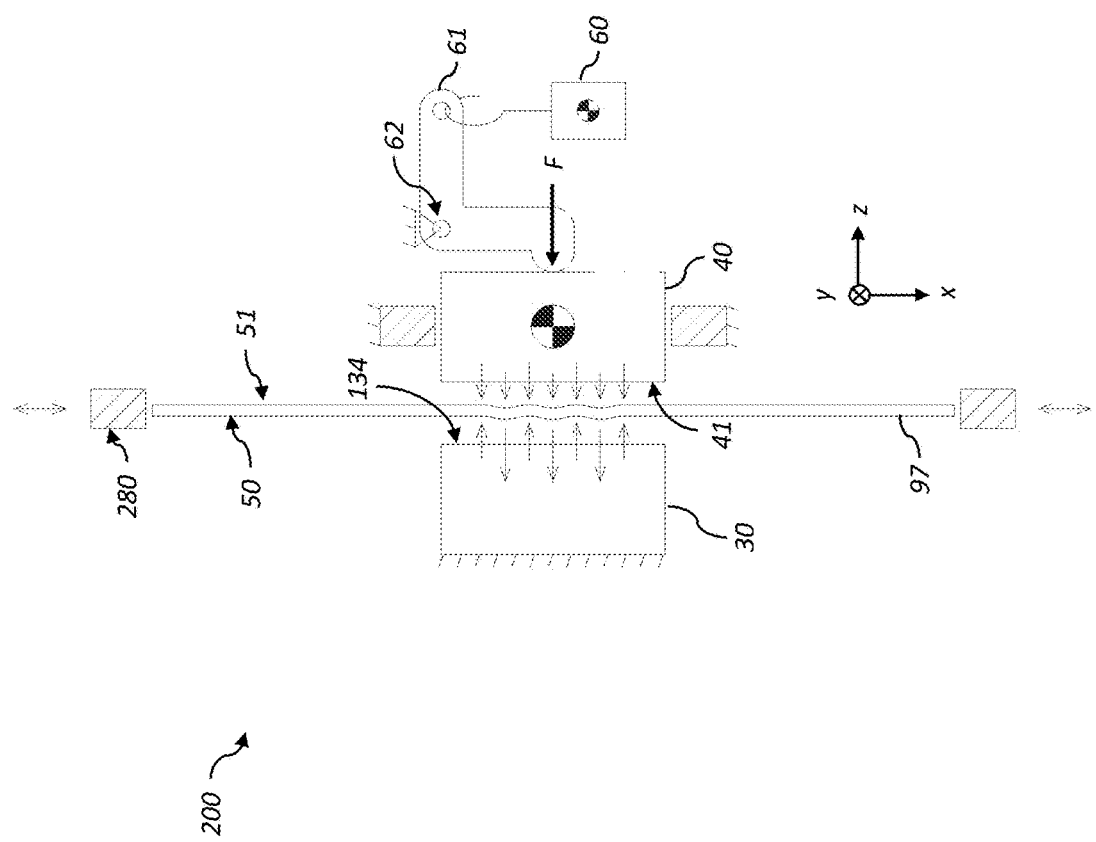
FIG. 10 illustrates a system including a deposition head and a gas-bearing backer with a flexible substrate positioned in a vertical orientation in accordance with an exemplary embodiment.

FIG. 9 illustrates the use of the SALD system 200 of FIG. 10 with a rigid substrate 97. When coating large rigid substrates 97, the gas-bearing backer 40 of the present invention is advantaged due its ability to supply a non-contact weight component, which enables the movement of the substrate 97 relative to the deposition head 30 to occur independent of the gas-bearing backer 40. In some embodiments, the gas-bearing backer 40 is also used to supply heat to the substrate 97 in order to maintain temperature during deposition.

For thin substrates 97, the weight of the substrate 97 in the vicinity of the deposition head 30 may be negligible compared to the weight of the gas-bearing backer 40. It is understood that the stack can be reoriented from vertical to other angles, such as horizontal, and the equivalent constant "gravitational" force can be imparted on the gas-bearing backer 40 by other means, such as a fixed weight transferred via a bell crank or levers. Other non-gravitational forces could also be employed using any type of force mechanism known in the art. The force applied by the force mechanism is preferably constant, or substantially constant. Furthermore, the force is substantially constant regardless of the substrate thickness and position. Within the context of the present disclosure, the term "substantially constant" means that there is no intentional variation of the quantity (e.g., the applied force) due to changes in the relevant system factors. Within the context of the present disclosure, the term "substantially constant" means that there is less than 25% variation during operation, preferably less than 15% variation, and more preferably less than 5% variation. One exemplary configuration is illustrated in FIG. 10. In this example, the substrate 97, the output face 134 of the deposition head 30 and the output face 41 of the gas-bearing backer 40 are all oriented vertically. A fixed mass 60 is hung from an L-shaped lever 61, which is pivotable about a pivot point 62. The lever 61 applies a constant horizontal force F onto the gas-bearing backer 40 (which will be equal to the weight of the mass 60 when the arms of the lever 61 have an equal length).

The design considerations are different for the low stiffness free-motion gas-bearing backer 40 of the present invention than for typical industrial gas bearings or for the fixed dual-sided gas bearings previously employed for wafer processing. The gas-bearing backer 40 of the present invention does support a load, making it similar in some sense to industrial gas bearing; however, as mentioned previously, the only load supported by gas flow through the output face 41 of the gas-bearing backer 40 is the weight of the gas-bearing backer 40 itself, so that the load (and correspondingly, the required gas pressure) is very low compared to other systems.

For comparison, industrial gas bearings are commonly used in way systems, such as guidance systems of precision machinery, where the advantages of negligible friction, negligible wear, heavy load bearing capability, and high stiffness are critical to accurate positioning performance. In typical industrial systems, standardized bearings are placed around precision finished spars, for example lapped granite beams or accurately ground metallic bars having precise straightness and parallelism. Each bearing is typically mounted with a hemispherical ball socket such that the bearing face conforms to the plane of the guiding spar and thus acts to provide a point support. As a point load support, the actual pressure profile under common industrial bearings is not important, only the integrated pressure over the bearing area. In practice, two separated bearings are used to define a line, and three separated bearings are used to define a plane, according to basic geometric principles, and are used to support not just the spar, but typically a substantial load. Furthermore, the multiple bearings are required to provide the necessary roll and pitch stiffness in industrial systems, since no individual bearing is configured to provide these functions for these applications. While industrial gas bearings have various constructions and designs, none are well suited for the backside-bearing of the present invention. Industrial gas bearings that utilize an impermeable plane, such as a lap finished metallic plate with a central gas source or bearings comprised of a central relieved cavity and a perimeter land that creates a restricted gas passage when placed near a guiding surface, are known to collapse if a moment load is introduced that allows the individual bearing to become tilted with respect to the adjacent surface. Under these conditions, the pressurized gas within the industrial bearing is able to vent to the surroundings through an open side of the gap (caused by the tilt of the impermeable plane of the bearing), causing a loss of levitation and allowing the near side of the bearing to make contact with the adjacent surface. Such an impermeable industrial bearing is not capable of stably levitating a flexible sheet of material.

An industrial alternative to the impermeable designs are porous gas bearings. Porous gas bearings can provide an advantage that gas flow is distributed through the whole bearing surface rather than through single or few discrete orifices. Porous bearings are not subject to complete collapse if tilted and can remain functional with minor defects such as scratches. Porous bearings can support moment loads within limits. However, commercial machine element porous gas bearings typically have load capability in tens of pounds per square inch at source pressures of 60 psig and higher. High stiffness on the order of $3 \times 10^5$ pounds/inch for a bearing area of 3200 mm$^2$ is desirable in machine applications and is achieved by means of preloading the bearing using opposing bearings acting on parallel surfaces (loaded against each other). Alternatively, a vacuum preload can be used to achieve the same effect, for example using a vacuum preloaded bearing between two positive pressure bearings on the same surface. For industrial bearing systems, the vacuum preloaded bearings typically use a vacuum level of about ⅔ of an atmosphere due to both the ease of obtaining this vacuum level (i.e., with simple vacuum pumps, such as rotary vane types) and in order to minimize bearing area, as higher vacuum levels require less preload area resulting in more compact bearing assemblies.

The gas-bearing backer 40 of the present invention is unique, in part because it is used singly and not in conjunction with other bearings to define a line or plane. It has no mounting interface to interact with other machine elements or external loads. It provides sufficient pitch and roll stiffness to maintain itself in a stable position. In an exemplary configuration, the gas-bearing backer 40 has a rigid housing with a porous media membrane. Any suitable porous material with the desired gas permeability can be used. Membranes with a permeability-to-thickness ratio (k/t) of greater than $1 \times 10^{-9}$ inches are preferred. One exemplary porous material that can be used for the present invention is porous graphite, which is desirable due to its commercial availability. Graphite is used for electric discharge machining (EDM) processes, and is available as a commodity, and has a range of grain sizes which leads to a useful range of gas permeability. As will be discussed later, in preferred embodiments of the present invention, the porous material layer includes a rib structure internal to the backside-bearing construction.

Figure 11:
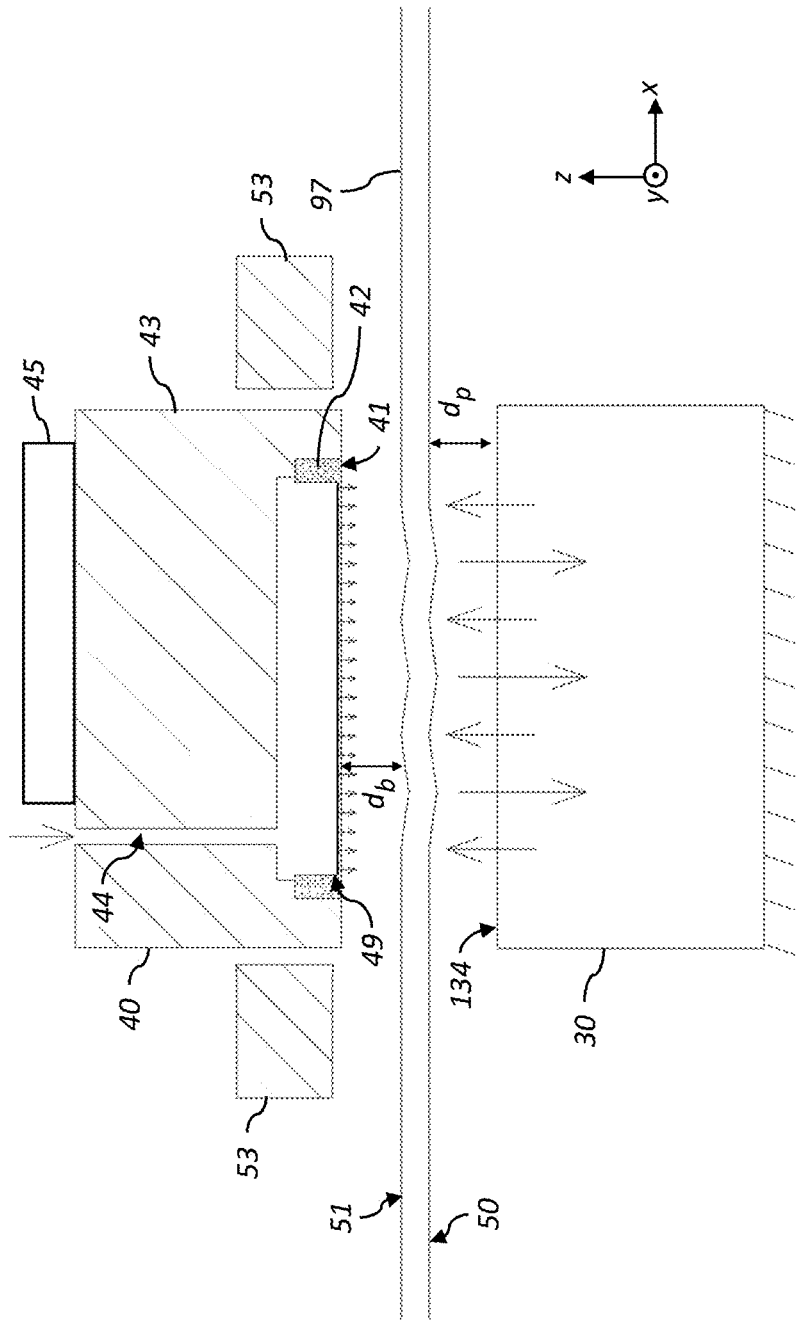
FIG. 11 illustrates an exemplary gas-bearing backer configuration.
Figures 22A, 22B:
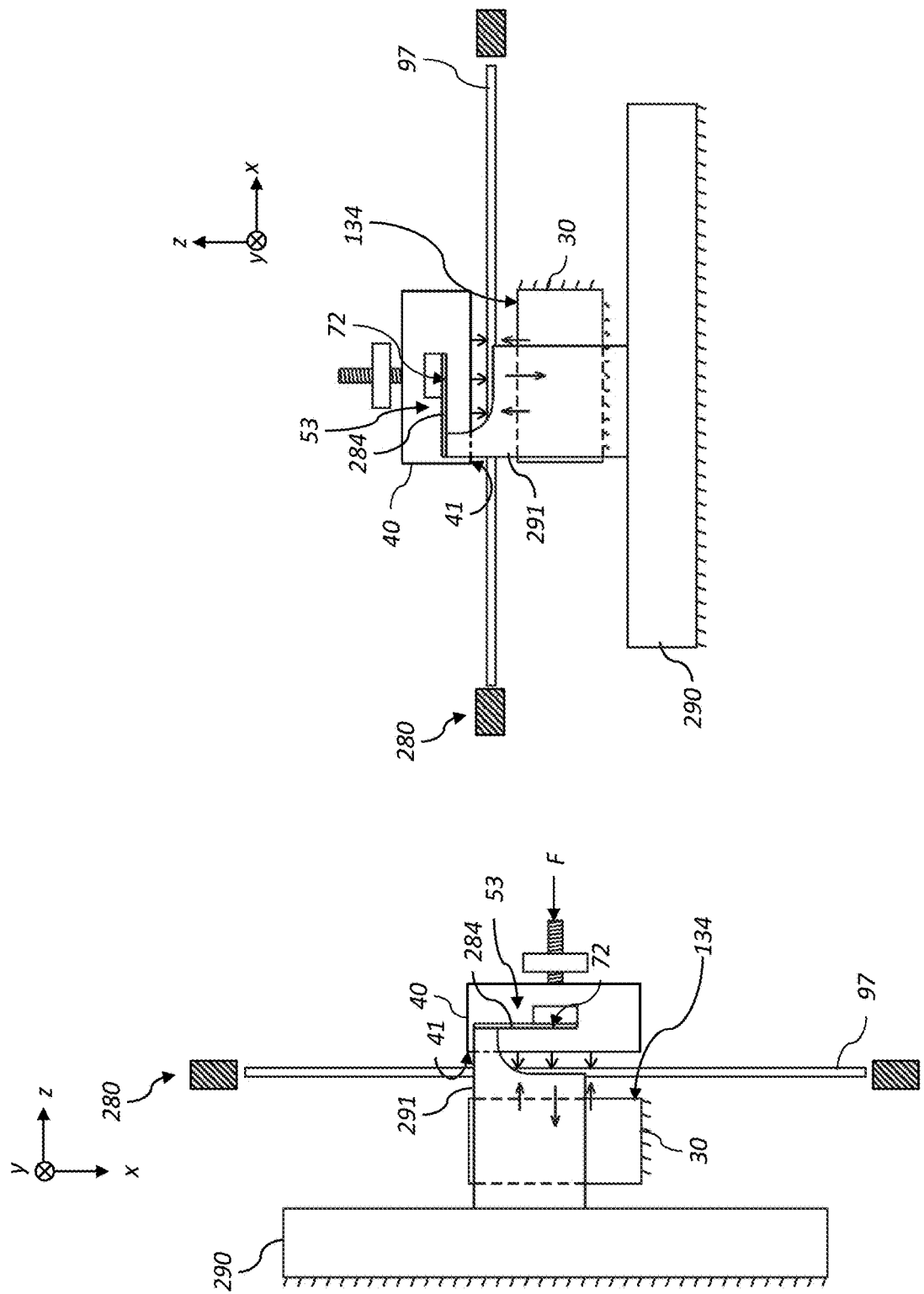
FIGS. 22A and 22B are cross-sectional views of exemplary systems including a deposition head and a gas-bearing backer wherein flexures are used to provide a lateral constraint for the gas-bearing backer.

An exemplary gas-bearing backer 40 configuration is illustrated in FIG. 11. The gas-bearing backer 40 has an output face 41 which faces the second surface 51 of the substrate 97, and includes a porous material layer 42 mounted in a rigid backer housing 43. The porous material layer 42 includes a thin porous membrane 49. Gas enters the gas-bearing backer 40 from an external gas source (not shown) and flows through a gas manifold 44 within the backer housing 43 and out of the output face 41 through the porous material layer 42. Gas can be supplied to the gas manifold 44 by any type of gas source available in the art. For SALD applications, the gas is preferably an inert gas such as nitrogen. In other arrangements, the gas can be air or some other gaseous substance. A lateral constraint system 53, constrains the gas-bearing backer 40 from moving laterally in a plane parallel to the output face 134 of the deposition head 40 while enabling the gas-bearing backer 40 to move freely in a direction normal to the output face 134 of the deposition head 30. In an exemplary configuration, the gas-bearing backer 40 fits within an opening in the lateral constrain system 53 that is slightly larger than the perimeter of the gas-bearing backer 40. In other configurations, different types of lateral constraint systems 53 can be used to constrain the lateral position of the gas-bearing backer 40. For example, FIGS. 22A-22B illustrate a configuration where flexures 284 provide the lateral constraint feature. Other configurations of lateral constraint systems 53 are within the scope of the present invention as long as they constrain motion in the x-direction, y-direction, and rotation about the z-axis, and retain freedom of motion in the z-direction, and rotation around the x-axis and y-axis.

In some embodiments, the gas-bearing backer 40 includes a heater 45 to provide non-contact heating to the substrate 97, which can be useful in SALD systems, as well as other in other applications. Heat supplied by the heater 45 heats the backer housing 43 and the porous material layer 42. Heat from the output face 41 of the gas-bearing backer 40 then heats the substrate 97 by conductive heating.

Typical porous gas bearing operating temperatures are considered to be within +/−30° F. of ambient. It is normally an advantage that the low friction of gas bearings, caused only by the viscous shear of the working gas, results in negligible heat generation. The upper operating temperature of the heated gas-bearing backer 40 of the present invention is much greater, on the order of 300° C., to provide desirable heat transfer levels during SALD deposition. Efficient use of pressurized gas results in low mass flows and the heat energy wasted by convection of gas escaping from the bearing perimeter is small.

As previously discussed, thermal conduction of energy across the gas film is the primary mechanism for substrate heating; this is primarily dependent on gas film thickness and not on gas flow rate. Any appropriate type of heater 45 known in the art can be used in accordance with the present invention. Preferably, the heater 45 does not contribute any significant disturbance to the constant force on the substrate 97 provided by the gas-bearing backer 40. In an exemplary configuration, the heater 45 is a resistive heater cartridge which is mounted internally or external to the backer housing 43. Resistive cartridge heaters are well known and require a source of electric current, which in some embodiments can be provided by flexible wires which are carefully routed and suspended to minimize forces and moments imparted on the gas-bearing backer 40. In other configurations, a wireless power transfer mechanism, such as magnetic induction coils on the heater 45 and nearby fixed structure, can convey electricity to the gas-bearing backer 40 acting as a gas coupled transformer. In alternative embodiments, metallic portions of the gas-bearing backer 40 are directly heated by high frequency induction heating (i.e., eddy current heating). Other examples of heater mechanisms that can be used in accordance with the present invention include infrared (IR) absorption and pumping of heated working fluids. In some configurations, porous graphite of the porous material layer 42 can be used as a resistive heater.

The gas flow through the porous material layer 42 can be controlled by controlling the gas pressure or the gas flow provided by the gas source. The gas-bearing backers 40 of the present invention typically operate at low source pressures with a low overall volumetric gas flow when compared to other gas-bearing designs. In one exemplary configuration, the gas pressure supplied to the gas-bearing backer 40 is 0.043 psi. Most commercially available pressure regulators do not operate well as this low pressure level. In an exemplary embodiment, a "T" arrangement of adjustable flow restrictors (e.g., needle valves) can be used downstream of a pressure regulator to vent part of the gas flow to atmosphere and thus reduce the pressure supplied to the gas-bearing backer 40.

In alternative embodiments, the gas-bearing backer 40 can have an internal means for generating the necessary gas pressure for bearing operation. For example, an embedded fan in gas-bearing backer 40 can be used similar to the operation of a hovercraft. Embodiments having an embedded fan have the advantage of the fan being able to operate at variable speed, therefore can be used to supply a variable pressure to the gas-bearing backer 40, allowing for dynamic control.

To better understand the features of the gas-bearing backers 40 of the present invention, a number of examples will be discussed.

Comparative Example

Figure 12:
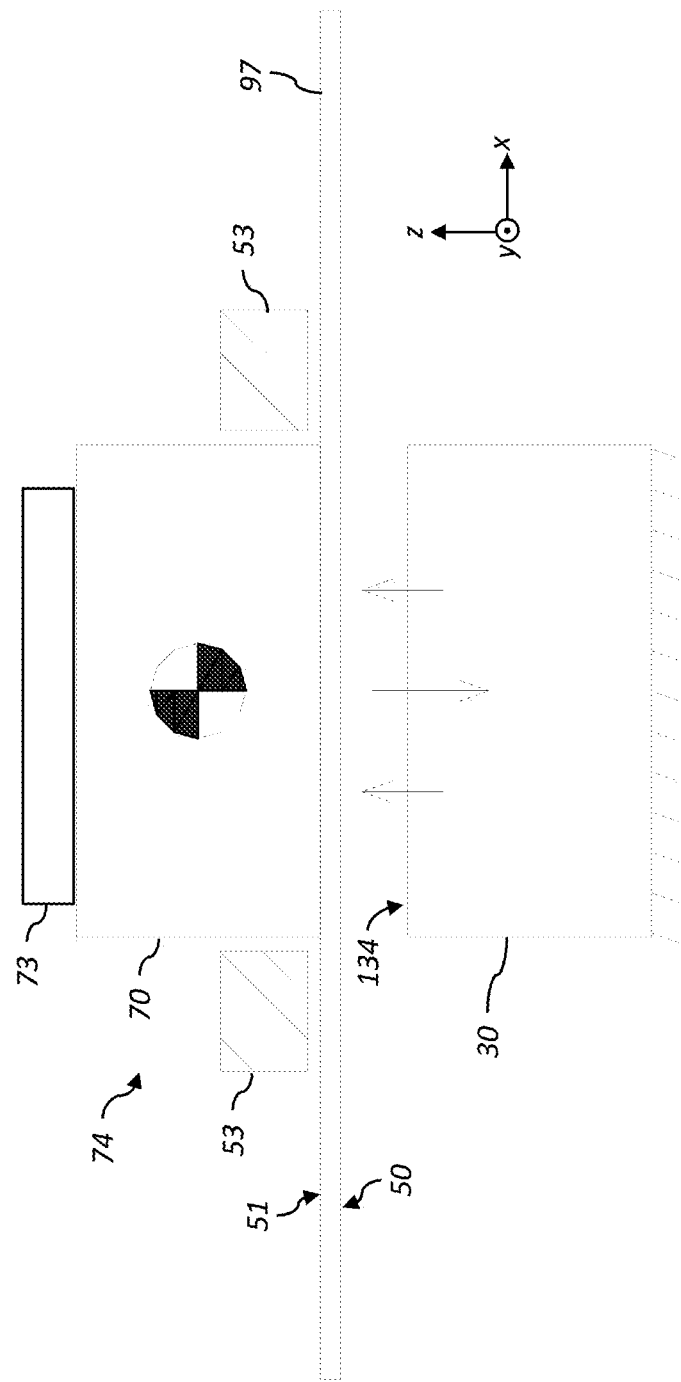
FIG. 12 illustrates a comparative example using a vacuum backer.

In a comparative SALD system configuration, a rigidly attached heated vacuum backer device 70 is used as is illustrated in FIG. 12. The heated vacuum backer device 70 is temporarily attached to and moves with the substrate 97 to form a combined substrate unit 74, which in this example is a 2.5" square flexible or rigid substrate. A resistive cartridge heater 73 is mounted to the vacuum backer device 70 to provide heat during SALD deposition. The mass of the vacuum backer device 70, including the heater 73, is 91 g. The mass of a 2.5 inch square×0.003 inch thick polyimide substrate, attached to the vacuum backer is negligible in this example. The weight per unit area of the substrate unit 74 (combined vacuum backer device 70 and substrate 97) is approximately 0.04 psi. The combination of the vacuum backer device 70 and the substrate 97, provide a load that is supported by the high-stiffness gas bearing of the deposition head 30. Useful gas-bearing backers 40 of the present invention provide a similar load to the substrate 97, such that the SALD system operates at the desired process-gap.

Inventive Examples

The gas-bearing backers 40 of the following Inventive Examples are intended to supply a similar load (and therefore a similar average pressure) on the substrate 97 as the previously described Comparative Example so that a consistent gap between the substrate 97 over the deposition head 30 is maintained. In each of the Inventive Examples, the width of the gas-bearing backer 40 was designed to be 2 inches to match the size of an exemplary deposition head 30.

Electro Carb EC-12, a commercially available porous graphite material, was chosen for the porous material layer 42. The gas permeability of Electro Carb EC-12 was measured to be $2.15 \times 10^{-11}$ inch$^2$. The permeability test was as follows: a plate of Electro Carb EC-12 graphite was machined to a thickness of 0.1082 inch and tested in a Gurley Porosimeter with an aperture area of 1.0 inch$^2$; the average time to pass 25 cc of gas at 1.22 kPa differential pressure was 126 secs.

The gas-bearing backer 40 of Inventive Example #1 was constructed using the Electro Carb EC-12 material for the porous material layer 42 in a rigid aluminum backer housing 43. The mass of the gas-bearing backer 40 is predominately the mass of the aluminum backer housing 43 that holds the porous material layer 42. The exemplary gas-bearing backer 40 of Inventive Example #1 has a mass of approximately 90 g, nominally matching the mass of the vacuum backer device 70 of the Comparative Example. The porous material layer 42 of Inventive Example #1 is porous membrane made of Electro Carb EC-12 with a thickness of 0.125 inch within the aluminum backer housing 43, and is used as the output face 41 of the gas bearing backer 40. The construction of Inventive Example #1 uses a membrane thickness that is consistent with commercial bearings where the porous media must withstand source pressures of 10 s of psi, but is within the form factor required for the system usage. The corresponding permeability/thickness ratio (k/t) for Inventive Example #1 is $1.72 \times 10^{-10}$ inch.

Figure 13:
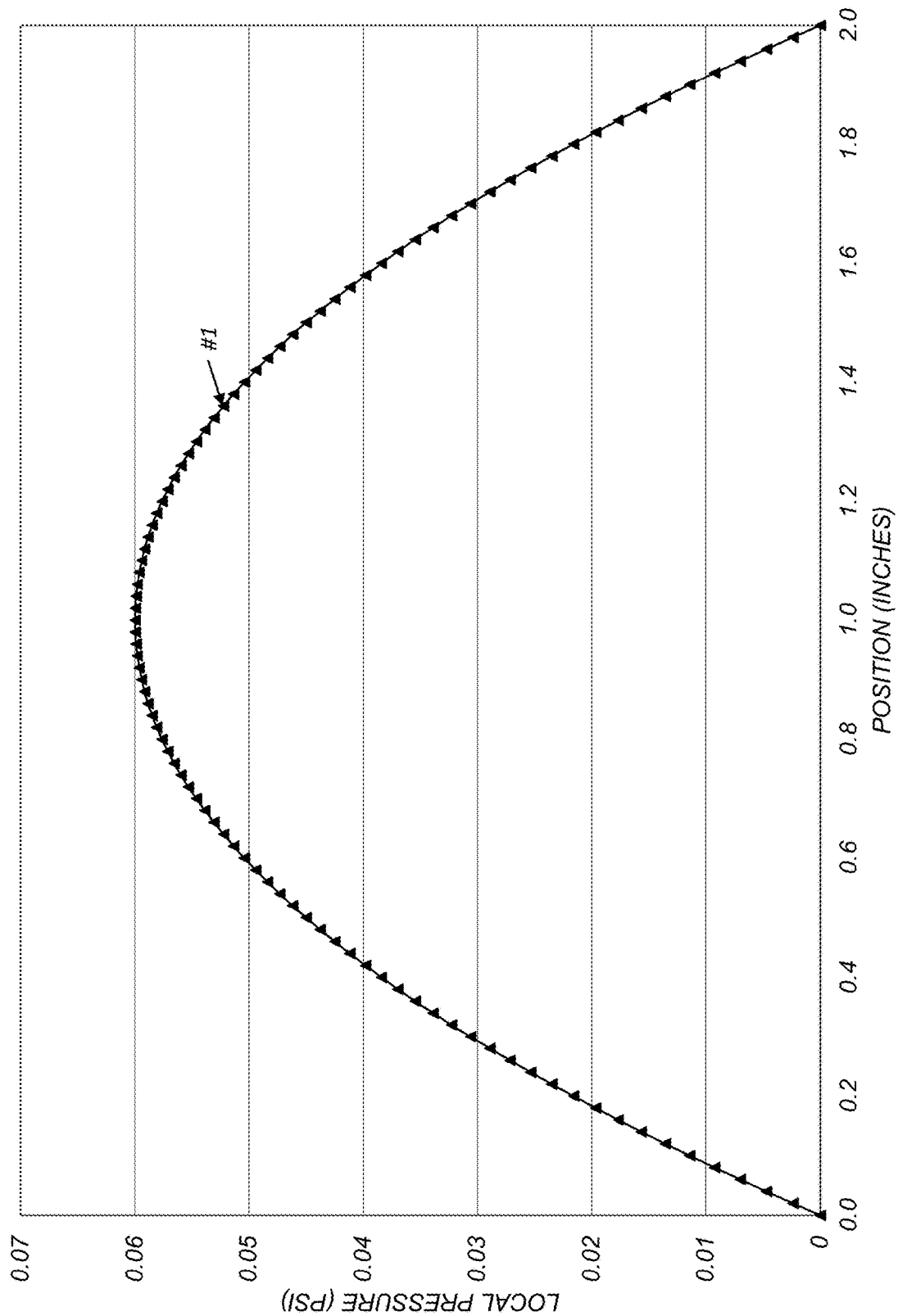
FIG. 13 illustrates a calculated pressure distribution for a gas-bearing backer corresponding to Inventive Example #1.

A one-dimensional simulation of the gas pressure distribution between the gas-bearing backer 40 and the second surface 51 of the substrate 97 was performed, where the inputs to the simulation are source pressure, membrane thickness, and load, and the output of the simulation are backside-gap $d_b$ (i.e., fly height) and pressure distribution. At a source pressure of 30 psi, the gas-bearing backer 40 of Inventive Example #1 has a relatively large backside-gap of 0.0046 inch (116 μm). FIG. 13 is a graph showing the pressure distribution at these conditions. As shown, the pressure distribution has a large peak of 0.060 psi when the gas-bearing backer 40 is operated at a source pressure of only 30 psi. While the gas-bearing backer 40 of Inventive Example #1 can perform the function of loading the substrate to a deposition head 30, the peaked pressure distribution is undesirable in flexible substrate applications, because the flexible substrate is not loaded uniformly against the output face 134 of the deposition head 30, and therefore may flutter and detach at the periphery.

Figure 14:
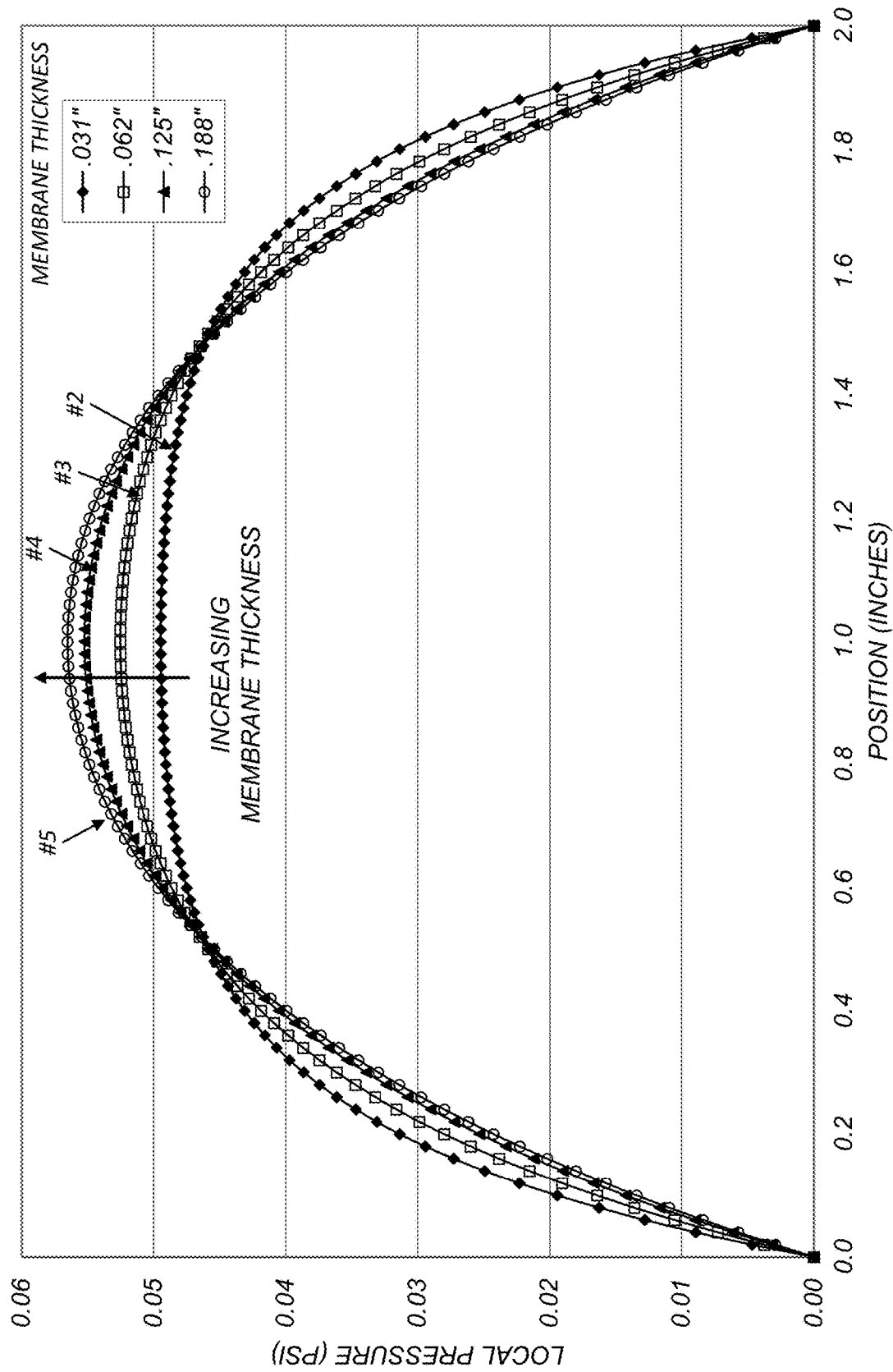
FIG. 14 illustrates calculated pressure distributions for gas-bearing backers corresponding to Inventive Examples #2-5.

Inventive Examples #2 through #5 were constructed in a similar manner to Inventive Example #1 with the following exceptions. The permeability of the porous membrane was adjusted to be $4.0 \times 10^{-12}$ inch$^2$ (which is more typical for finer grain graphite materials), and the membrane thickness was varied as follows: Inventive Example #2 has a membrane thickness of 0.031 inch, Inventive Example #3 has a membrane thickness of 0.062 inch, Inventive Example #4 has a membrane thickness of 0.125 inch, and Inventive Example #5 has a membrane thickness of 0.188 inch. The corresponding permeability/thickness ratios for Inventive Examples #2 through #5 are: k/t=$1.29 \times 10^{-10}$ inch, k/t=$6.45 \times 10^{-11}$ inch, k/t=$3.20 \times 10^{-11}$ inch, and k/t=$2.13 \times 10^{-11}$ inch, respectively. The necessary source pressure and corresponding pressure distribution were calculated for each example using a backside-gap of $d_b$=0.0004 inch. FIG. 14 shows the calculated pressure distribution for these four examples. The source pressure necessary to maintain the constant backside-gap increases with increasing membrane thickness. If alternatively, the source pressure was to be fixed, thicker membranes will result in a lower backside-gap. Regardless of the source pressure, increasing the membrane thickness exacerbates the pressure distribution peak, and therefore thinner membranes are required for use in flexible substrate applications.

Figure 15:
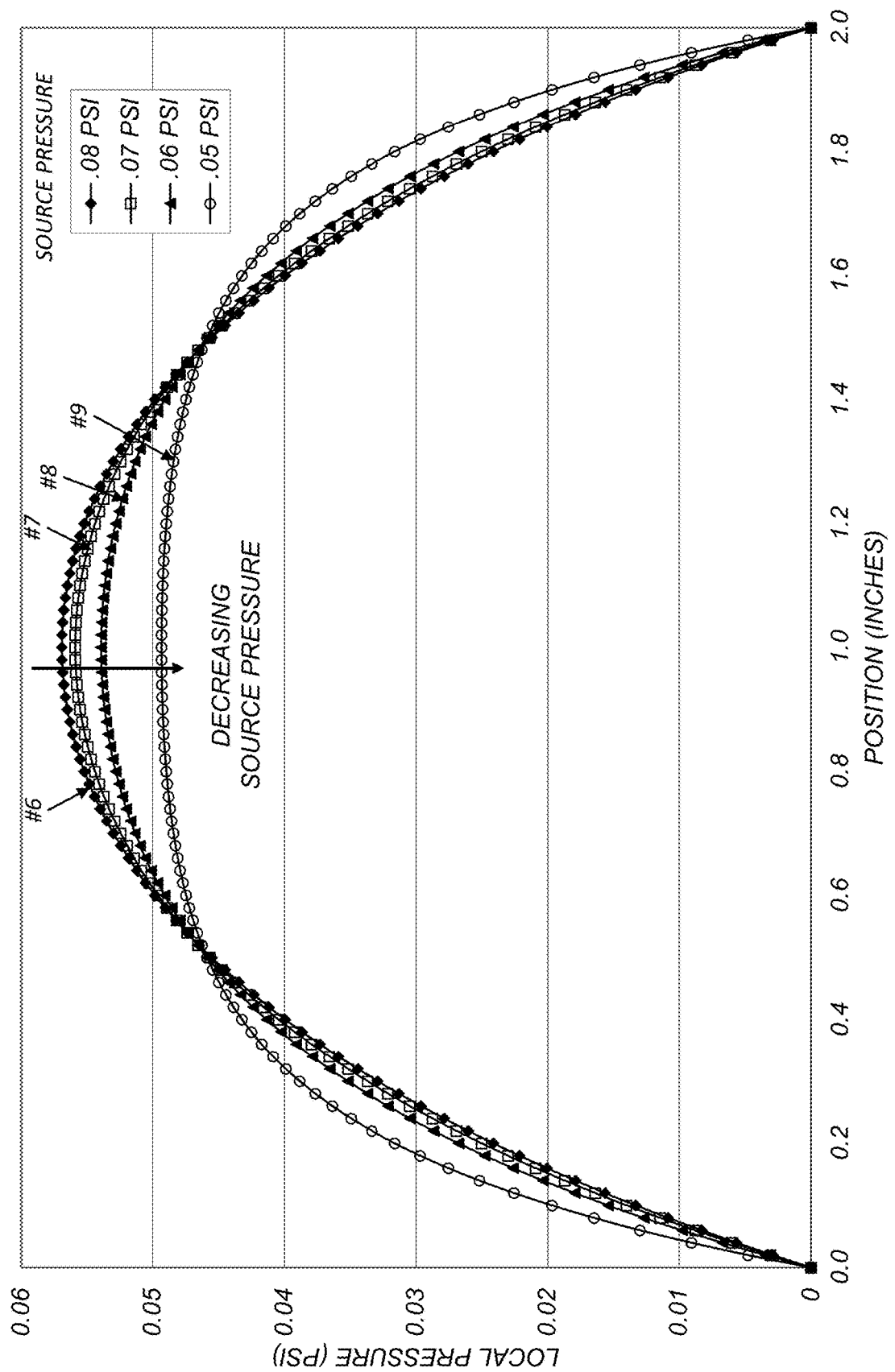
FIG. 15 illustrates calculated pressure distributions for gas-bearing backers corresponding to Inventive Examples #6-9.

Inventive Examples #6 through #9 were constructed in a similar manner to Inventive Example #5 with the following exceptions. The membrane thickness was varied as required to maintain a backside-gap of $d_b$=0.0004 inch (10 μm) at the following source pressures: the source pressure of Inventive Example #6 was 0.08 psi, the source pressure of Inventive Example #7 was 0.07 psi, the source pressure of Inventive Example #8 was 0.06 psi, and the source pressure of Inventive Example #9 was 0.05 psi. As the source pressure was decreased, the required membrane thickness decreased resulting in an increasing permeability-to-thickness ratio. FIG. 15 shows the calculated pressure distribution under these conditions. It can be seen that the pressure uniformity is improved as the source pressure is reduced (with a correspondingly thinner membrane and higher k/t). The pressure profiles illustrated in FIGS. 14 and 15 demonstrate that the shape of the pressure profile for a fixed backside-gap and load is a function of the ratio of permeability/thickness (k/t), wherein a higher k/t results in a flatter profile.

Figure 16:
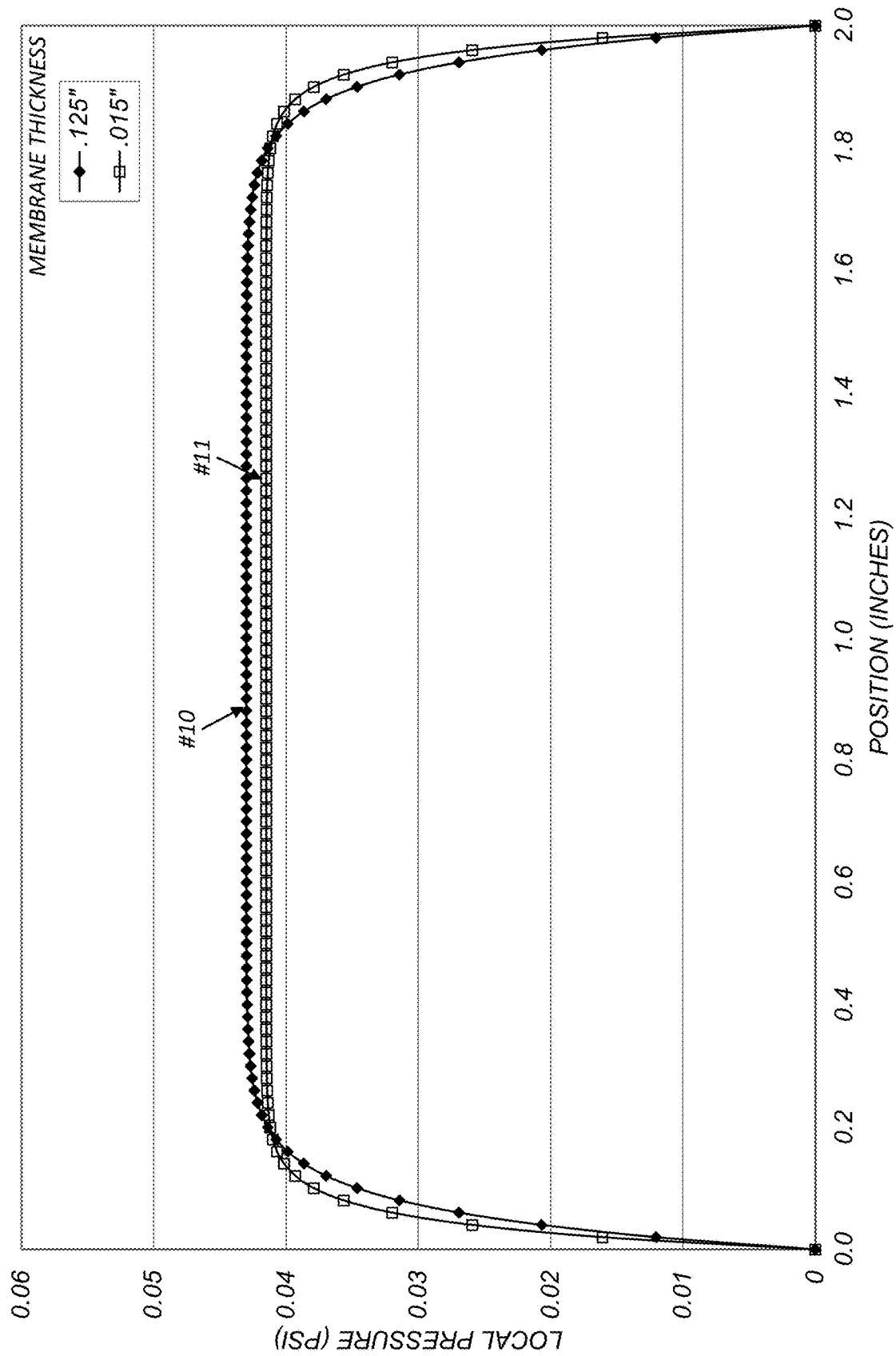
FIG. 16 illustrates calculated pressure distributions for gas-bearing backers corresponding to Inventive Examples #10-11.

Inventive Examples #10 and #11 were constructed in a similar manner to Inventive Example #5 with the following exceptions. As with previous examples, the gas-bearing backers 40 of Inventive Examples #10 and #11 were designed to be operated with a backside-gap of $d_b$=0.0004 inch. Inventive Example #10 used a porous membrane thickness of t=0.125 inch supplied with a source pressure of 0.042 psi. FIG. 16 shows a computed pressure profile for a load of 0.200 lb. It can be seen that the pressure profile is uniform to within 5% over more than 80% of the width of the bearing area. In other embodiments, pressure profiles can be uniform to within 15% over at least 80% of the width of the bearing area. To achieve the flat pressure profile, the required permeability of the membrane under these conditions is $4.0 \times 10^{-10}$ inch$^2$, for a permeability/thickness ratio of k/t=$3.2 \times 10^{-9}$ inch. A survey of available graphite materials shows that this range of permeability is not readily available as a stock item as the major market for graphite blocks favors finer grain structures.

A number of available materials were investigated for suitability for use as the as the porous material for the inventive backside-bearing. The porous material must have a low enough permeability to provide the required pressure drop for the bearing to be stable. The porous material must also have sufficient mechanical integrity in a thin membrane for both handling considerations and in order to withstand the pressure fields in operation. For use in SALD systems, it is also desired that the backer-face of the backside-bearing has a high degree of flatness. Sintered metal particles and woven or perforated screens have a permeability that is too large, or in instances where the permeability is suitable have insufficient flatness for the bearing face. Sintered plastic filter materials are available with permeability values in the desired range, and can be used for backside-bearings whose operating temperature is limited to be compatible with the plastic material. Columnar porosity in anodized alumina structures can also be used in the present invention, however cost and potential issues with the brittle structures make it a less preferred material, particularly for SALD equipment of any reasonable scale. Preferred porous membranes of the present invention are porous on a microscopic scale, much smaller than the thickness of the porous material layer. A range of porous graphite materials are preferred for use in backside-bearings of the present invention due to their availability, permeability and structural properties.

Inventive Example #11 used the commercially-available Electro Carb EC-12 graphite for the porous membrane, as discussed above, with a permeability of $2.15 \times 10^{-11}$ inch$^2$. The membrane thickness was t=0.015 inch, providing a permeability/thickness ratio of k/t=$1.43 \times 10^{-9}$ inch. FIG. 16 shows the calculated pressure profile corresponding to a backside-gap of $d_b$=0.0004 inch and a source pressure of 0.043 psi. It can be seen that the pressure is substantially uniform over 90% of the length of the bearing. The normal direction stiffness of the porous membrane of Inventive Example #11 is approximately 31 lb per inch deflection.

Figure 17:
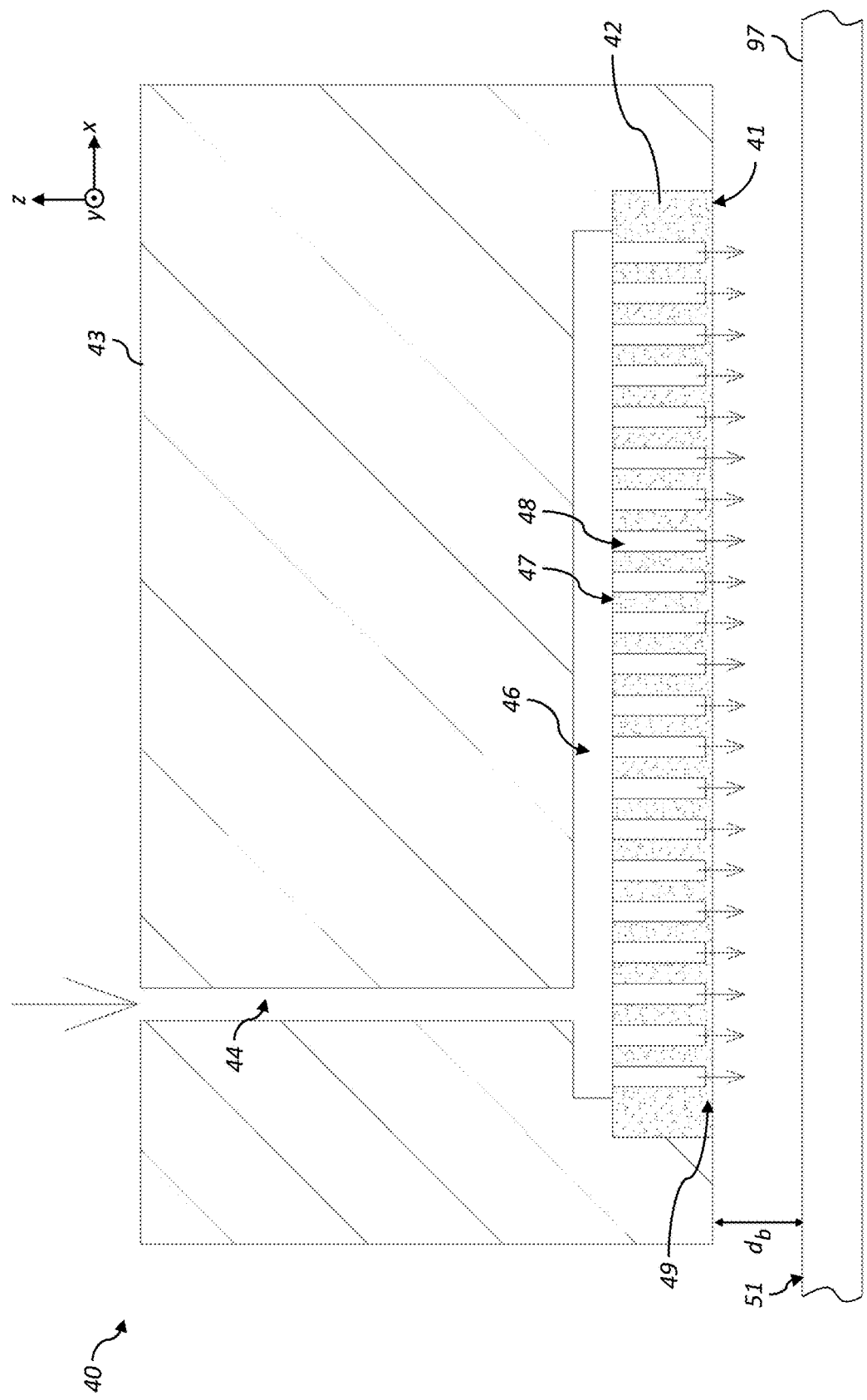
FIG. 17 is a cross-sectional view of an exemplary gas-bearing backer including a porous material layer having a rib structure.

Table 1 summarizes the operating conditions and results for Inventive Examples #1 to #11. As described earlier, some of the operating conditions are dependent variables whose values depend upon the specified conditions and the independent variable settings. In those cases, the dependent variable settings are noted as "calculated." The "Pressure Profile Quality" column is a subjective rating based upon the uniformity of the pressure between the output face 41 and the second surface 51 of the substrate 97. When the pressure is uniform to within 5% across at least 80% of a width of the output face, the Pressure Profile Quality is classified as "Very Good;" when the pressure is uniform to within 15% across at least 80% of a width of the output face, the Pressure Profile Quality is classified as "Good;" when the pressure is uniform to within 15% across at least 60% of a width of the output face, the Pressure Profile Quality is classified as "Fair;" and when the uniformity of the pressure is worse than 15% across at least 60% of a width of the output face, the Pressure Profile Quality is classified as "Poor." It can be seen that the configurations that produce "Good" or "Very Good" results are those that include porous membranes with a permeability-to-thickness ratio (k/t) of greater than $1 \times 10^{-9}$ inches.

in FIG. 17. (The portion of the porous material layer 42 below the bottom of the grooves 48 functions as the porous membrane 49.)

A porous material layer 42 corresponding to the porous membrane 49 was constructed having the rib structure illustrated in FIG. 17 to provide an embodiment of Inventive Example #12. A 0.100 inch thick block of Electro Carb EC-12 graphite was machined to have a repeating rib structure with 0.070 inch wide grooves 48 and 0.030 inch wide ribs 47, providing a porous membrane at the bottom of each groove 48 having a thickness of approximately 0.030 inch. The rib width was advantageously chosen to be within a factor of 2× of the porous membrane thickness (i.e., between 50% and 200% of the porous membrane thickness) at the bottom of the grooves 48. As such, the flow of gas supplied to a groove 48 is able to diffuse diagonally beneath the ribs 47 (from both sides) without excessive path length increase compared to the normal flow path, and exits the output face 41 with nearly uniform flow and minimum disturbance from the rib structure.

The machined porous material layer 42 was installed in a pocket on the bottom surface of an aluminum backer housing 43 and permanently attached. The backer housing 43 included a gas manifold 44 with a cross-groove 46 running perpendicular to the ribbed structure so that the pressurized gas supplied by the gas source is distributed to each of the grooves in the porous material layer 42, and thus to the entire bearing area. The aluminum body was constructed such that the net weight of the gas-bearing backer 40 was 0.200 lb, matching the weight of the vacuum backer device 70 of the previously-discussed Comparative Example, such that the average pressure imparted by the gas-bearing backer 40 to the substrate 97 is the same as the load imparted by the vacuum backer device 70. The output face of the graphite

TABLE 1

| Example | Membrane Permeability (inch$^2$) | Membrane Thickness (inch) | Porous Membrane k/t (inch) | Source Pressure (psi) | Backside Gap (inch) | Pressure Profile Quality |
|---|---|---|---|---|---|---|
| #1 | $2.2 \times 10^{-11}$ | 0.125 | $1.72 \times 10^{-10}$ | 0.04 | 0.0046 | Poor |
| #2 | $4.0 \times 10^{-12}$ | 0.031 | $1.29 \times 10^{-10}$ | calculated | 0.0004 | Fair |
| #3 | $4.0 \times 10^{-12}$ | 0.062 | $6.45 \times 10^{-11}$ | calculated | 0.0004 | Poor |
| #4 | $4.0 \times 10^{-12}$ | 0.125 | $3.20 \times 10^{-11}$ | calculated | 0.0004 | Poor |
| #5 | $4.0 \times 10^{-12}$ | 0.188 | $2.13 \times 10^{-11}$ | calculated | 0.0004 | Poor |
| #6 | $4.0 \times 10^{-12}$ | calculated | calculated | 0.08 | 0.0004 | Poor |
| #7 | $4.0 \times 10^{-12}$ | calculated | calculated | 0.07 | 0.0004 | Poor |
| #8 | $4.0 \times 10^{-12}$ | calculated | calculated | 0.06 | 0.0004 | Poor |
| #9 | $4.0 \times 10^{-12}$ | calculated | calculated | 0.05 | 0.0004 | Fair |
| #10 | $4.0 \times 10^{-10}$ | 0.125 | $3.20 \times 10^{-9}$ | 0.20 | 0.0004 | Good |
| #11 | $2.5 \times 10^{-11}$ | 0.015 | $1.43 \times 10^{-9}$ | 0.043 | 0.0004 | Very good |

The gas-bearing backers 40 of the present invention operate at a surprisingly reduced source pressure, three orders of magnitude less than normal gas bearing practice. Preferably, the gas-bearing backers 40 include porous membranes that are thin and are constructed from a material such as porous graphite. Given the thickness and the porous nature of the preferred porous membranes, there are structural factors that need to be considered for the design of these membranes to provide the necessary performance and durability. In an exemplary embodiment, to prevent bursting and excessive out of plane deflection of the porous membrane (which would compromise the ability to achieve uniform backside-gaps), a ribbed supporting structure, including a series of ribs 47 and grooves 48, is machined into a monolithic graphite block to fabricate a porous material layer 42 which includes the porous membrane 49 as shown block was lapped after assembly to achieve flatness better than 10 μm. After the lapping operation, the membrane thickness was reduced somewhat such that it was about 0.015-0.030 inch (with a nominal thickness of 0.015 inch corresponding to Inventive Example #11). The ribbed supporting structure provides the additional advantage that they enable a larger area for thermal contact between the porous material layer 42 and the backer housing 43.

As discussed earlier, the gas-bearing backer 40 is adapted for use in an SALD deposition system in combination with a high-stiffness gas bearing deposition head 30. The ribs 47 of the gas-bearing backer 40 can be oriented at any angle with respect to the elongated slots in the output face 134 of the deposition head 30, and can be arranged to be parallel, perpendicular, or any intermediate angle. An operational test was conducted using a vacuum-preloaded gas-bearing SALD deposition head 30, a 3 mil Kapton substrate 97, and the described gas-bearing backer 40 of Inventive Example #12. The source pressure provided to the gas-bearing backer 40 was adjusted to lift the backside-bearing by 0.0002 inch (5 um) from the second surface 51 of the substrate 97. The operational test showed no evidence of contact on either side of the substrate 97, at both static conditions and as the substrate 97 was translated laterally between the gas-bearing backer 40 and deposition head 30.

The gas-bearing backer 40 of the present invention is able to support moment loads, allowing the gas-bearing backer 40 to be self-supported above the substrate 97 without danger of tipping or touching the substrate surface. The gas-bearing backer 40 has the ability to flatten corrugations in the substrate 97 caused by bending moments resulting from forces acting on the process-side (i.e., first side 50) of the substrate 97, such as the saw tooth pressure profile associated with gas-bearing SALD deposition heads 30. The porous material layer 42 of the gas-bearing backer 40 is porous on a microscopic scale, much smaller than the thickness of the porous material layer 40. This has the effect of the gas-bearing backer 40 acting as a multitude of tiny bearings that can respond to deviations in the backside-gap on a local scale; advantageously the local scale (e.g., the pore size and distribution of the porous membrane) of the gas-bearing backer 40 is smaller than the pitch of the gas slots in the SALD gas-bearing deposition head 30. Thus the gas-bearing backer 40 provides pressure preferentially on the high points of any substrate corrugations, reducing the amplitude of the corrugations.

The gas-bearing backer 40 functions without contacting the substrate 97. While the net stiffness of the gravity-loaded gas-bearing backer 40 of the present invention is zero, due to its ability to seek an equilibrium position without other restraint, the local stiffness between the substrate and backside-bearing backer face is not zero and is on the order of 31 lb/in over the deposition head area, as was described with respect to Inventive Example #11.

In SALD systems, the substrate 97 is confined between the gas-bearing backer 40 and the deposition head 30. In this configuration, any out of plane excursions must be less than the gap between the deposition head 30 and the gas-bearing backer 40, minus the substrate thickness (i.e. the sum of the backside-gap $d_b$ and the process process-gap $d_p$ measured at a common point on the substrate 97). In order to compensate for any corrugation in the substrate 97 caused by the pressure distribution of the deposition head 97 or substrate features deviations, the gas-bearing backer 40 provides a locally differential force on the substrate surface, resulting in a pressure distribution which acts to flatten the substrate 97. The ability of the gas-bearing backer 40 to provide this differential force locally to the substrate 97 is influenced by the ability to exhaust gas from substrate areas that are relatively far, in the normal direction, from the gas-bearing backer 40 (such as the valleys of corrugation or dimples in the substrate). In embodiments where the gas-bearing backer 40 is used in conjunction with a gas-bearing SALD deposition head 30, the linear arrangement of the gas slots in the deposition head 30 can impart an out-of-plane distortion (i.e., corrugation) in the substrate 97 with continuous valleys allowing gases to exhaust to the edges of either the substrate 97 or the gas-bearing backer 40. In wide-SALD systems, the width of the gas-bearing backer 40 will be approximately the same as the width of the deposition head 30. Under conditions where the substrate 97 is distorted, the valley can extend the full width of the substrate 97, and the ability to vent the gas supplied by the gas-bearing backer 40 in a central region between the gas-bearing backer 40 and the substrate 97 becomes increasingly restrictive with increasing substrate width.

Figure 18:
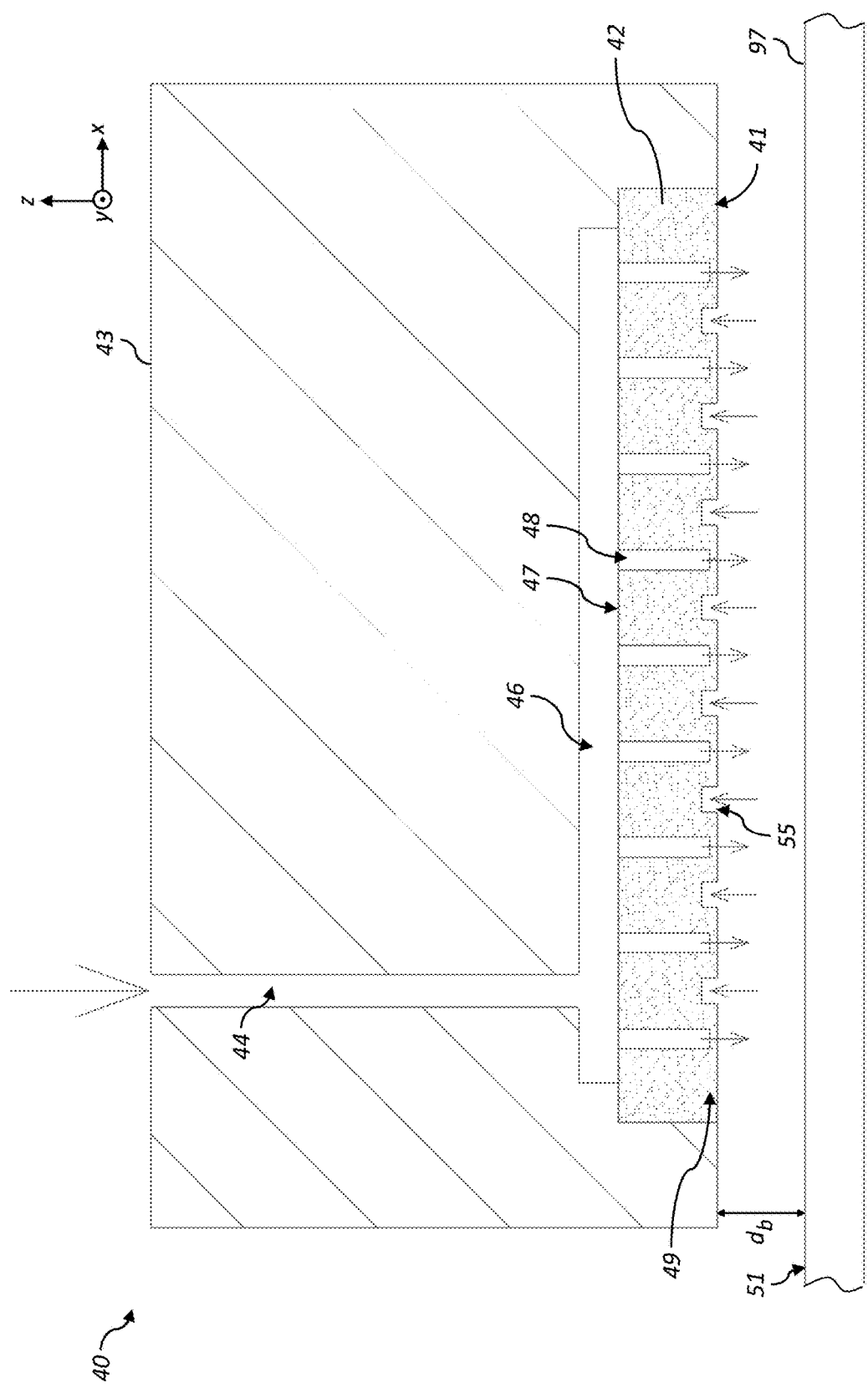
FIG. 18 is a cross-sectional view of an exemplary gas-bearing backer including a porous material layer having a rib structure and vent grooves.
Figure 19:
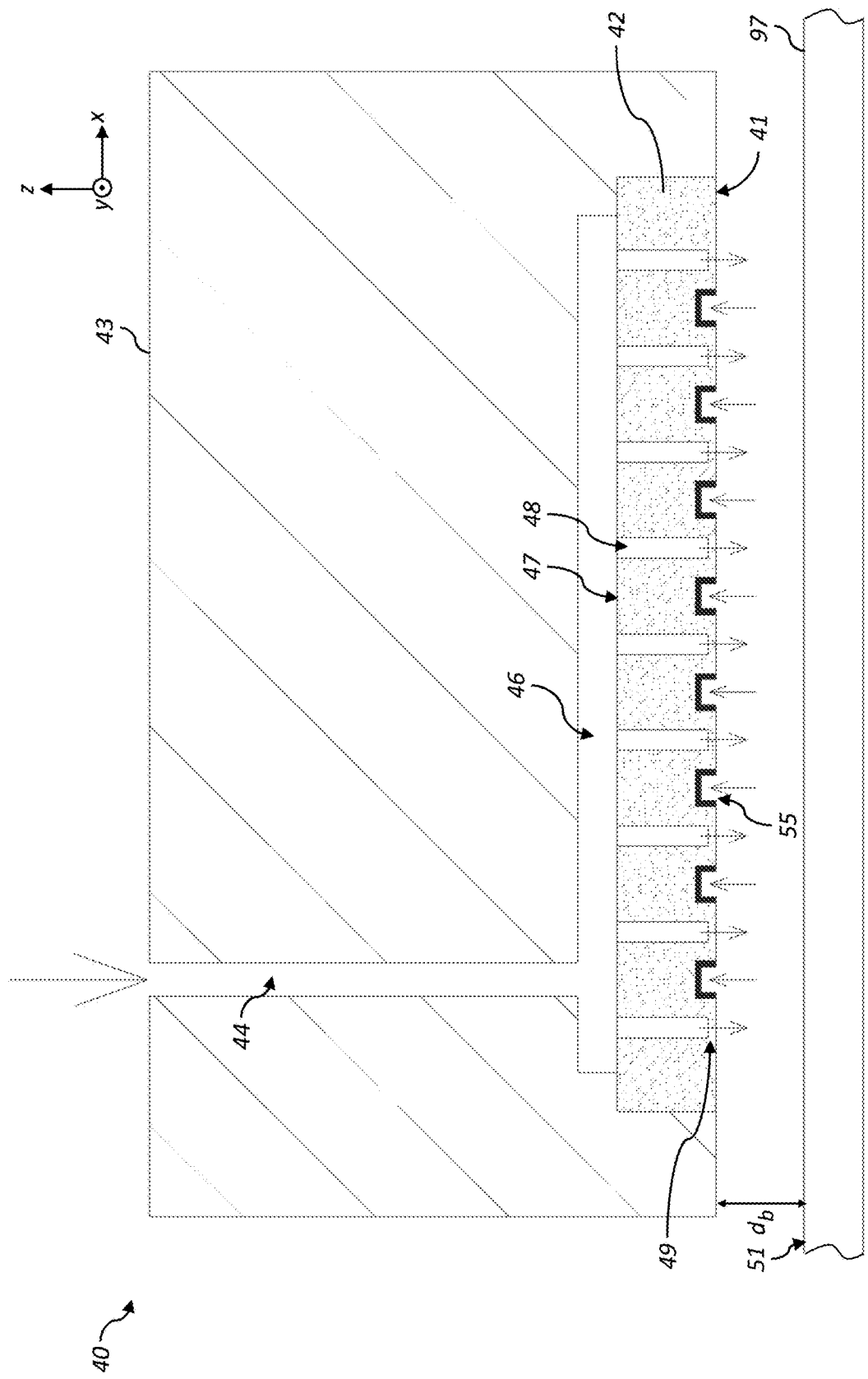
FIG. 19 is a cross-sectional view of an exemplary gas-bearing backer including a porous material layer having a rib structure and impermeable vent grooves.

In some embodiments, improved venting is achieved by providing vent grooves 55 in the output face 41 of the gas-bearing backer 40 as illustrated in FIG. 18. In the illustrated configuration, the vent grooves 55 are located coincident with the ribs 47 in the porous material layer 42 so that gas conductance directly from the interior of the gas-bearing backer 40 to the vent grooves 55 (i.e., internal leakage) is reduced. The rib width in this embodiment may be advantageously made thicker than that given by the ratio described in Example #12 to reduce diagonal diffusion into the grove. In a preferred arrangement, the surfaces of the vent grooves 55 are treated to be non-porous, as illustrated in FIG. 19. One example process for treating the vent grooves 55 is illustrated in FIG. 20A. In a first step, the entire porous surface is rendered impermeable by a coating process as shown in FIG. 20A, which applies a coating 58 over the output face 41. Subsequently, portions of the coating 58 are removed from the land areas 56 of the output face 41 (for example, using a lapping operation) to restore local gas conductance through the land areas, resulting in the structure for the porous material layer 42 illustrated in FIG. 20B.

Figure 21A:
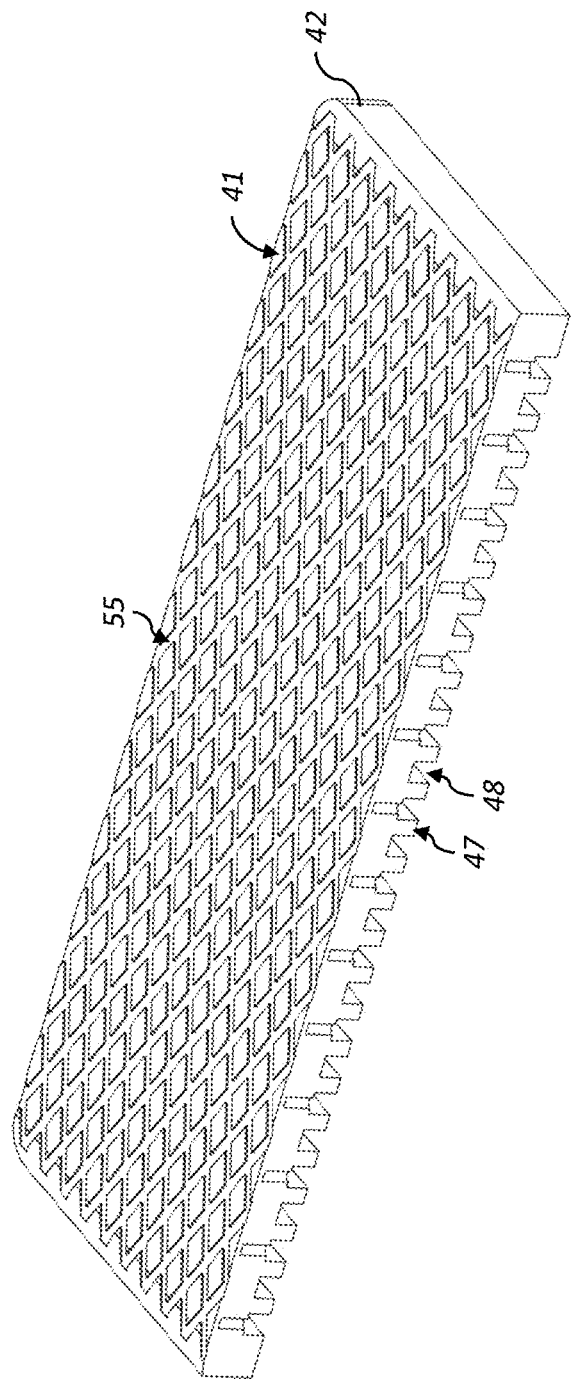
FIG. 21A is a bottom-side sectional-view of a gas-bearing backer having a diamond grid pattern on the output face.
Figure 21B:
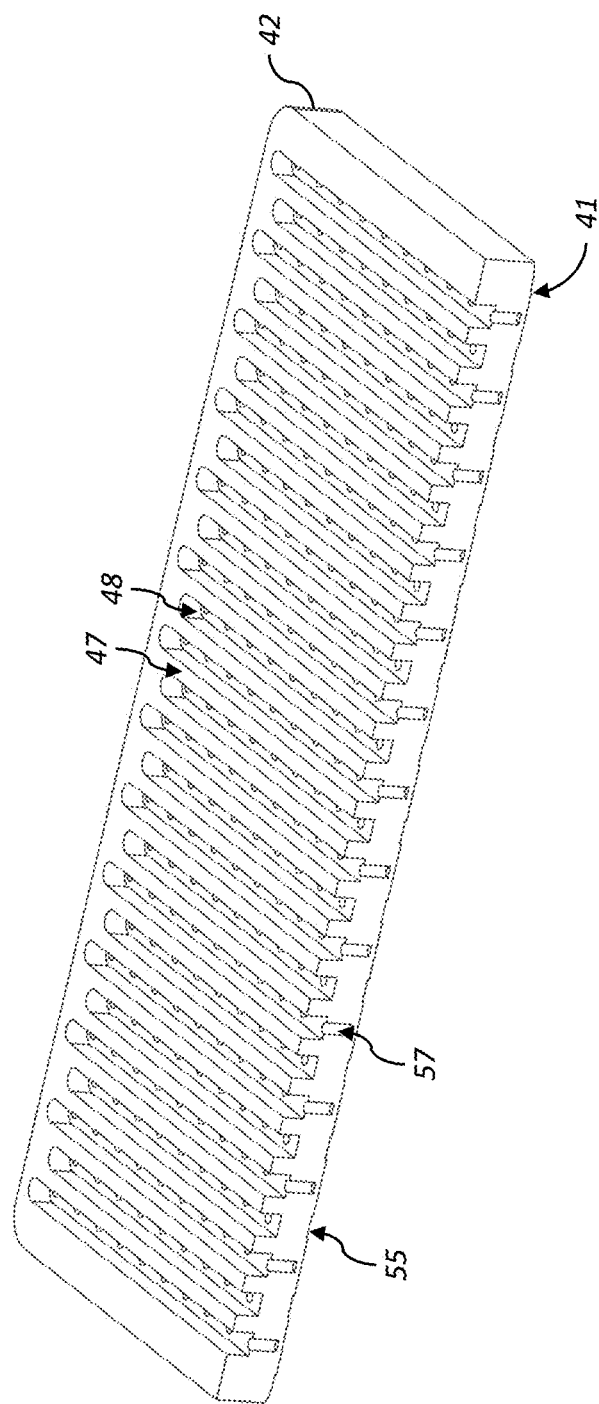
FIG. 21B is a top-side sectional-view of the gas-bearing backer of FIG. 21A showing internal support ribs, grooves and blind holes on the side opposite the output face.

FIGS. 21A and 21B show different views of the same porous material layer 42 having vent grooves 55 and land areas 56 on an output face 41, Supporting ribs 47 and grooves 48 are formed on the opposite face, with an array of blind holes 57 extending from the bottom of the grooves 48 partway through the remaining thickness of the porous material layer 42. In this case, the thickness of the porous material layer 42 between the bottom of the blind holes 57 and the output face 41 can be considered to be thickness of the porous membrane. The illustrated cross hatched arrangement of the vent grooves 57 results in an array of diamond shaped land areas 56. The blind holes 57 are preferably located in the center of these land areas 56. In an exemplary arrangement, the blind holes 57 are formed by drilling from the interior side of the porous material layer 42 without breaking through the output face 41. The diameter and depth of the blind holes 57, and the pitch of the vent grooves 55, are co-designed to allow the majority of the source gas to be emitted via the land areas 56, thus providing local lift. The diamond array illustrated in FIG. 21A serves to establish a multitude of co-planar nodes. Local beam stiffness of the substrate 97 contributes to minimizing deflection between nodes. This minimization of deflection is advantageous when using low stretch substrates 97, which are known to not 'like" to form compound curvatures (i.e., it resists the formation of compound curvatures due to corresponding increase in strain energy).

In some embodiments of the present invention, the lateral constraint system 53 uses flexures 284 for constraining the x, y, and theta z position of the gas-bearing backer 40 over the output face 134 of the deposition head 30 as illustrated in FIGS. 22A and 22B. In some embodiments, the flexures 284 can comprise sheet or wire elements. The flexures 284 can be provided by a single planar sheet or two parallel sheets joined by a common rigid member. In this embodiment, the attachment of the "free end" of the flexures 284 to the gas-bearing backer 40 is by means of bosses having surfaces aligned with the axis of the center of gravity 72 of the gas-bearing backer 40. The plane of the flexures 284 is parallel to the output face 134 of the deposition head 30. The "fixed" end of the flexures 284 is attached to a bracket 291 on a backer positioner 290, which can also be considered to be components of the lateral constraint system 53. The lateral constraint system 53 is attached directly or indirectly to a fixed base or pedestal depending on the specific requirements of the SALD system. FIG. 22A illustrates the use of flexures in a vertically-oriented SALD system, while FIG. 22B illustrates a similar system having a horizontal orientation. As discussed earlier, in the horizontal configuration of FIG. 22B, the weight of the gas-bearing backer 40 provides a downward force on the gas-bearing backer 40 that is passed on to the substrate 97. In the vertical orientation of FIG. 22A, a constant horizontal force F is shown that serves the same function; this force can be provided using any force mechanism known in the art such as that discussed with reference to FIG. 10.

Alternative embodiments providing equivalent constraint utilize three wire flexures 284, where two of the flexures 284 are located in the plane of the center of gravity 72 of the gas-bearing backer 40 and oriented parallel to the output face 134 of the deposition head 30. These flexures 284 constrain motion in x and yaw. A third flexure 284 (not shown) is arranged in the direction parallel to the output face 134 of the deposition head 30 and perpendicular to the primary motion axis (i.e., the x-axis), intersecting the center of gravity 72 of the gas-bearing backer 40 in a plane parallel to the first flexures 284, and is preferably in the same plane as the first flexures 284. This third flexure 284 constrains the gas-bearing backer 40 from translation in y. The necessary degrees of freedom to allow equilibration of the gas-bearing backer 40 relative to the substrate 97 and the output face 134 of the deposition head 30, including pitch, roll, and translation in z, are advantageously preserved in this alternative embodiment.

In some embodiments of the present invention, the gas-bearing backer 40 provides heat to the substrate 97. In such embodiments, in addition to supporting the gas-bearing backer 40 the flexures 284 may advantageously be utilized to deliver electrical energy or fluid flows. In one embodiment, two parallel sheet metal flexures 284 are utilized to provide electrical current to heater elements or thermoelectric Peltier modules incorporated in the gas-bearing backer 40. Suitable conductive and insulating materials are used as necessary to define the current flow. In some configurations, electrically resistive properties of the porous membrane 49 may be used as a heating element.

In another embodiment, two of the wire flexures 284 are used to source and sink electrical energy while the third flexure 284 is tubular and is used to convey gas to the output face 41 of the gas-bearing backer 40. The straight path of the gas supply tube avoids disturbing forces caused by Bourdon tube effects (i.e.: forces due to pressure applied to unequal areas on inside or outside of bends).

The electrical energy conveyed to the backer may be modulated as a means to communicate process conditions between the gas-bearing backer 40 and the modular system control by means known to one skilled in electronics. Properties and process conditions that can be communicated include temperature, pressure, gap height, and sample presence. The gas-bearing backer 40 may include sensors and signal conditioning electronics in these embodiments. In some embodiments, communication can be accomplished by means of RF or optical links. While as described the flexures 284 are clear implementations of the necessary functionality, they are not exhaustive of the possible arrangements that could provide similar intent which are also included within the scope of the present invention.

In the case where a substrate 97 is rigid and the deposition head is vacuum-preloaded, the deposition head 30 determines the planar alignment of the substrate 97 without the assistance of a backing device, provided that the center of gravity of the substrate is not overhung by an excessive distance (beyond the tipping point as described in commonly-assigned, co-pending U.S. patent application Ser. No. 15/458,250 to Spath et al., entitled "Deposition system with vacuum pre-loaded deposition head," which is incorporated herein by reference). There are several reasons why a gas-bearing backer 40 (i.e., a gas-levitated backing device), which is constrained in the plane parallel to the output face 134 of the deposition head 30 and freely moveable to seek equilibrium in the normal direction, may provide additional utility. The gas-bearing backer 40 can provide a non-contact force vector directed toward the center of the deposition head 30 that will allow the substrate 97 to be translated in the in-track direction by a greater distance before reaching the tipping point, and thus allow for larger substrates 97 to be coated. The gas-bearing backer 40 may also be used as passive insulation to prevent heat loss from the substrate 97. Furthermore, the gas-bearing backer 40 may act as a non-contact heat source for transfer of thermal energy to the substrate 97.

For the case where the substrate 97 is rigid, the gas-bearing backer 40 does not need to provide a substrate flattening function, and the gas-bearing backer 40 does not need to be responsive to substrate distance variations in local areas over the full output face 41. In other words, the gas-bearing backer 40 does not need to behave as a multitude of tiny independently stiff bearings. Local stiffness is necessary for flexible substrates, and is a primary motivator for the use of the gas-bearing backer 40 described relative to FIG. 11 and FIGS. 13-21B including a porous material layer 42 to provide a substantially uniform pressure profile such as that shown in FIG. 16. Without this requirement, additional options are available for the design of the gas-bearing backer 40 for the case of a rigid substrate 97. Note that gas-bearing backers 40 using a porous membrane 49 are still applicable however. In which case certain examples that are not well suited for flexible substrates 97 are useful for rigid case (e.g., where the permeability-to-thickness ratio $K/t < 1 \times 10^{-9}$ inches).

Figure 23A:
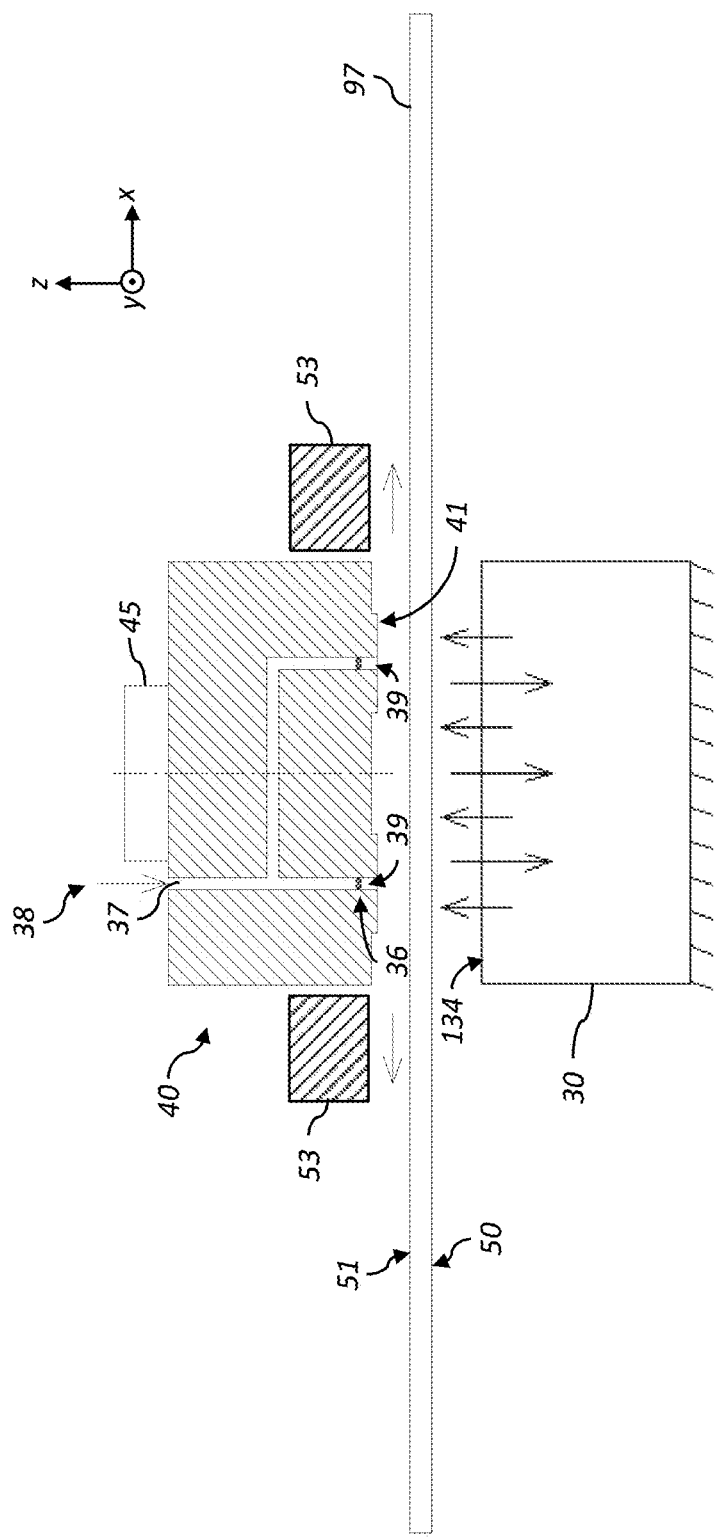
FIGS. 23A-23B illustrates a non-porous gas-bearing backer according to an alternate embodiment.

FIG. 23A shows a cross-section through one such example of a gas-bearing backer 40 which has an output face 41 having a plurality of output openings 39 through which a gas flow is provided from a gas source 38 to levitate the gas-bearing backer 40 over the substrate 97. Each of the output openings 39 effectively serves as an individual gas bearing. A lateral constraint system 53 (e.g., a frame) constrains lateral movement of the gas-bearing backer 40, while enabling it to freely move in a direction normal to the second surface 51 of the substrate 97.

As discussed previously, a single non-porous gas-bearing is sensitive to disruptions in lifting force when tipped. Basic geometry requires three points to determine a plane. A gas-bearing backer 40 can be constructed of non-porous material, such as aluminum, wherein three or more gas openings 39 are incorporated in a non-co-linear pattern. For example, the pattern may be three gas openings 39 in an equi-spaced polar array about a vertical axis passing through the center of gravity of the gas-bearing backer 40 (i.e., at the apexes of an equilateral triangle) as illustrated in the plan view shown in FIG. 23B. (The cross-section of FIG. 23A is taken through the line A-A' of FIG. 23B.)

Note that for the case of a gas-bearing backer 40 having a porous membrane 49, the pores in the porous membrane provide the output openings 39. It will be obvious to one skilled in the art that a wide range of variations can be used ranging between the three output opening 39 configuration of FIGS. 23A-23B to the porous membrane configurations which have a large number of output openings 39. Alternate embodiments can include a regular or irregular array including any number three or more output openings 39.

Preferably at least one additional non-collinear output opening 39 would exist in a plane parallel to the illustrated cross-section. The body of the gas-bearing backer 40 is comprised of a monolithic block of non-porous material (e.g., aluminum) having a weight corresponding to the desired down force to be imparted to the rigid substrate 97. Pressurized gas from a gas source 38 is supplied to the gas-bearing backer 40 through a single gas port 37. Individual independent gas bearings are located coincident with output openings 39 on the output face 41. The output face 41 of the gas-bearing backer 40 may be slightly relieved to better define the discrete land areas surrounding the output openings 39, where the pressure of the supplied gas acts to provide levitation. The output openings 39 have compensating orifices 36 which cause the exhaust pressure at the individual output openings 39 to drop as the gap between the land area of the output face 41 and the substrate 97 increases, leading to stability in the gap distance. The gas-bearing backer 40 as described is sufficient to impart non-contact normal force to a substrate 97.

As discussed previously, heat transfer by conduction through a sufficiently thin levitating gas film is an effective means of heating a substrate 97. To provide a substrate heating functionality, a heater 45 is attached to, or integrated within, the body of the gas-bearing backer 40. As discussed earlier, in an exemplary embodiment the heater 45 is an electric resistive cartridge heater. In other embodiments, any appropriate type of heater 45 known in the art can be used, such as those that were previous discussed. The energy can be conveyed to the heater 45 by any appropriate means, such as those that were previously discussed means. In some embodiments, the heater 45 can be external to the gas-bearing backer 40. In other embodiments, the heater can be internal to the gas-bearing backer 40.

For heat transfer effectiveness (i.e., reducing thermal resistance), it is preferable that the thermal gap (i.e., the physical gap wherein thermal energy is transferred by means of conduction through the levitating gas) between the gas-bearing backer 40 and the substrate 97 be no more than 100 µm, and more preferably no more than 50 µm. The gas supply pressure, compensating orifice, and land area are chosen such that the gap between the land areas surrounding output openings 39 and the substrate 97 is a fraction of the preferred thermal gap. The relief of the output face 41 of the backer, non-inclusive of the land areas, is preferably small such that the total gap between the backer relief surfaces and the substrate is no more than the preferred thermal gap.

The non-contact heated gas-bearing backer 40 as just described is advantaged over known substrate heat transfer devices because it is continuously self-adjusting and is able to maintain a consistent thermal gap, closer than would be achievable with rigidly mounted heaters, for a wide range of substrates having thickness variations that are significantly larger than the desired thermal gap.

Figure 23B:
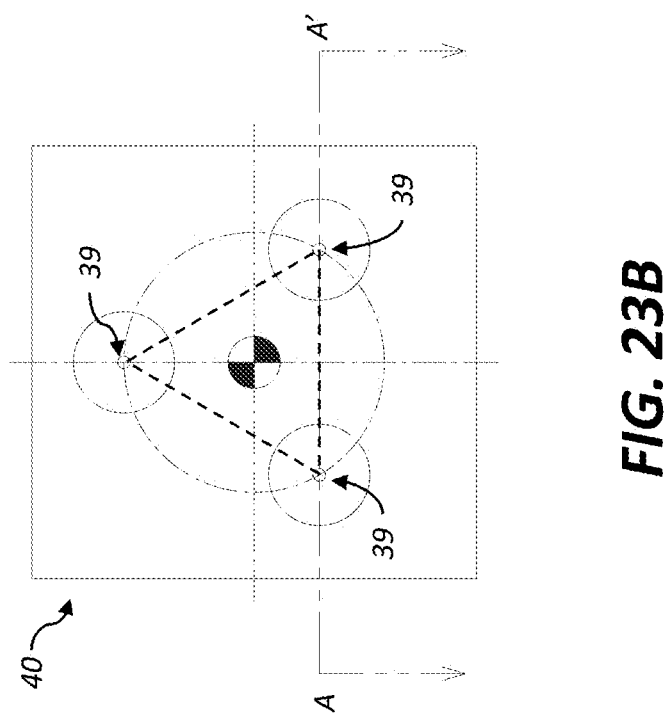

In arrangements such as that shown in FIGS. 23A-23B, the vacuum-preloading of the deposition head 30 provides stiffness to the position of the substrate 97 in the z-direction relative to the output face 134 of the deposition head 30. It is possible in some applications to not utilize vacuum as the primary or sole preloading means. The weight of the non-contact gas-bearing backer 40, or a force imparted to it, may be used in conjunction with the deposition head 30 flow characteristics to reduce the fly height (gap) on the deposition side of the substrate 97 and correspondingly increase stiffness while preserving non-contact transport. The gas-bearing backer 40 can provide heating functionality by maintaining a small conduction thermal resistance by means of a small physical gap (e.g., less than 100 µm, and preferably less than 50 µm), and by incorporating a heater 45 with the device gas-bearing backer 40.

The invention has been described in detail with particular reference to certain preferred embodiments thereof, but it will be understood that variations and modifications can be effected within the spirit and scope of the invention.

PARTS LIST 15 external environment
30 deposition head
36 compensating orifice
37 gas port
38 gas source
39 output opening
40 gas-bearing backer
41 output face
42 porous material layer
43 backer housing
44 gas manifold
45 heater
46 cross-groove
47 ribs
48 grooves
49 porous membrane
50 first surface
51 second surface
53 lateral constraint system
55 vent groove
56 land area
57 blind hole
58 coating
60 mass
61 lever
62 pivot point
70 backer device
72 center of gravity
73 heater
74 substrate unit
80 gas delivery zone
97 substrate
98 motion arrow
110 gas slot
112 output slot
114 exhaust slot
134 output face
200 SALD system
205 deposition subsystem
210 deposition unit
270 relative motion means
280 substrate positioner module
284 flexure
290 backer positioner
291 bracket
305 deposition zone
308 inert zone
309 inert zone
313 first reactive gas zone
314 purge zone
315 second reactive gas zone
321 left edge 322 right edge
401 output slots

The invention claimed is:

1. A gas-levitated substrate backing system for providing heat and a non-contact force onto a surface of a substrate, comprising:
 a gas-levitating backer structure having an output face, wherein the output face includes three or more output openings;
 a gas source for providing a gas flow through the output openings; and
 a heater for heating the gas-levitating backer structure;
 a lateral constraint system that constrains the movement of the gas-levitating backer structure in a plane parallel to the surface of the substrate while enabling the gas-levitating backer structure to move in a direction normal to the surface of the substrate;
 wherein the gas-levitating backer structure fits within an opening in the lateral constraint system or the lateral constraint system includes a flexure attached to the gas-levitating backer structure;
 wherein the gas flow through the output face is controlled to lift the gas-levitating backer structure away from the surface of the substrate such that there is no mechanical contact between the gas-levitating backer structure and the surface of the substrate while providing the non-contact force onto the surface of the substrate, and wherein a gap between the output face and the surface of the substrate is controlled by the gas flow.

2. The gas-levitated substrate backing system of claim 1, wherein the gas-levitating backer structure includes a porous material layer of a porous material, the porous material layer having an outer surface facing the surface of the substrate and an inner surface facing a gas manifold, wherein pores in the porous material provide the output openings, and wherein the output face corresponds to the outer surface of the porous material layer.

3. The gas-levitated substrate backing system of claim 1, wherein the gas-levitating backer structure heats the surface of the substrate by conductive heating.

4. The gas-levitated substrate backing system of claim 1, wherein the gas flow through the output face is controlled such that a gap between the output face and the surface of the substrate is no more than 50 μm.

5. The gas-levitated substrate backing system of claim 1, wherein the flexure includes a means for conveying energy to the gas-levitating backer structure or conveying electrical signals to or from the gas-levitating backer structure.

6. The gas-levitated substrate backing system of claim 1, wherein the lateral constraint system includes a gas supply tube which supplies gas to the gas-levitating backer structure.

7. The gas-levitated substrate backing system of claim 1, wherein the non-contact force applied to the surface of the substrate is no more than 1.0 pounds per square inch of the output face.

8. The gas-levitated substrate backing system of claim 1, wherein the surface of the substrate is oriented in a horizontal orientation.

9. The gas-levitated substrate backing system of claim 8, wherein the gas-levitating backer structure applies a net force on the surface of the substrate corresponding to a weight of the gas-levitated substrate backing system.

10. The gas-levitated substrate backing system of claim 1, further including a vacuum-preloaded gas bearing having an output face, the vacuum-preloaded gas bearing being positioned in a fixed location on an opposite side of the substrate from the gas-levitating backer structure with the output face of the vacuum-preloaded gas bearing facing the opposite side of the substrate.

11. The gas-levitated substrate backing system of claim 10, wherein the vacuum-preloaded gas bearing is a thin film deposition head which deposits a thin film of material onto the opposite side of the substrate.

12. The gas-levitated substrate backing system of claim 1, further including a substrate positioning system that moves the substrate in a lateral direction parallel to the output face of the gas-levitating backer structure according to a specified motion pattern.

13. The gas-levitated substrate backing system of claim 1, wherein the heater is a resistive heater.

14. The gas-levitated substrate backing system of claim 1, wherein the heater is inside the gas-levitating backer structure.

15. The gas-levitated substrate backing system of claim 1, wherein a surface area of the substrate is greater than an area of the output face.

* * * * *